United States Patent
Kim et al.

(10) Patent No.: US 12,406,618 B2
(45) Date of Patent: Sep. 2, 2025

(54) DISPLAY DEVICE HAVING A PLURALITY OF ACTIVE LAYERS WITH DIFFERENT MATERIALS AND METHOD OF MANUFACTURING THE SAME

(71) Applicant: Samsung Display Co., LTD., Yongin-si (KR)

(72) Inventors: Jin Wan Kim, Hwaseong-si (KR); Seung Geun Lee, Hwaseong-si (KR); Sang Jo Kim, Daejeon (KR); Su Jeong Kim, Hwaseong-si (KR); Young Jin Song, Anyang-si (KR); Byung Ju Lee, Seoul (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 18/611,413

(22) Filed: Mar. 20, 2024

(65) Prior Publication Data

US 2024/0265854 A1 Aug. 8, 2024

Related U.S. Application Data

(63) Continuation of application No. 17/855,251, filed on Jun. 30, 2022, now Pat. No. 11,942,025.

(30) Foreign Application Priority Data

Oct. 13, 2021 (KR) .......................... 10-2021-0135760

(51) Int. Cl.
*G09G 3/32* (2016.01)
*G09G 3/20* (2006.01)
(Continued)

(52) U.S. Cl.
CPC ............. *G09G 3/32* (2013.01); *G09G 3/2007* (2013.01); *H01L 25/18* (2013.01);
(Continued)

(58) Field of Classification Search
CPC ........................................................ G09G 3/32
(Continued)

(56) References Cited

U.S. PATENT DOCUMENTS

2017/0194304 A1* 7/2017 Takeya ................. H01L 25/162
2018/0197921 A1 7/2018 Kim et al.
(Continued)

FOREIGN PATENT DOCUMENTS

| JP | 3906654 B2 | 4/2007 |
|---|---|---|
| KR | 2020-0129216 A | 11/2020 |
| KR | 2021-0073677 A | 6/2021 |

OTHER PUBLICATIONS

Baek, Seung-Hye et al., "Monolithic Multi-Color Tunable Inorganic Light-Emitting Diodes", Adv. Electron. Mater. (2021) 2100598; DOI: 10.1002/aelm.202100598 (9 pages).
(Continued)

*Primary Examiner* — Long D Pham
(74) *Attorney, Agent, or Firm* — Womble Bond Dickinson (US) LLP

(57) ABSTRACT

A display device includes a substrate, a plurality of pixel electrodes on the substrate and spaced apart from each other, a plurality of light-emitting elements on the plurality of pixel electrodes, respectively, and a common electrode layer on the plurality of light-emitting elements and to which a common voltage is applied. The plurality of light-emitting elements include a first light-emitting element that is configured to emit first light according to a first driving current and a second light-emitting element that is configured to emit second light according to a second driving current. An active layer of the first light-emitting element is the same as an active layer of the second light-emitting element.

20 Claims, 26 Drawing Sheets

(51) Int. Cl.
  H01L 25/18   (2023.01)
  H10H 29/14   (2025.01)
  *H01L 23/00*   (2006.01)
(52) U.S. Cl.
  CPC ... *H10H 29/142* (2025.01); *G09G 2300/0452* (2013.01); *H01L 24/05* (2013.01); *H01L 24/08* (2013.01); *H01L 24/13* (2013.01); *H01L 24/16* (2013.01); *H01L 24/48* (2013.01); *H01L 24/73* (2013.01); *H01L 24/81* (2013.01); *H01L 2224/05573* (2013.01); *H01L 2224/05582* (2013.01); *H01L 2224/05611* (2013.01); *H01L 2224/05624* (2013.01); *H01L 2224/05644* (2013.01); *H01L 2224/05647* (2013.01); *H01L 2224/05687* (2013.01); *H01L 2224/08148* (2013.01); *H01L 2224/13082* (2013.01); *H01L 2224/13111* (2013.01); *H01L 2224/13124* (2013.01); *H01L 2224/13144* (2013.01); *H01L 2224/13147* (2013.01); *H01L 2224/16145* (2013.01); *H01L 2224/48157* (2013.01); *H01L 2224/73207* (2013.01); *H01L 2224/80801* (2013.01); *H01L 2224/81801* (2013.01)

(58) Field of Classification Search
  USPC .......................................................... 345/690
  See application file for complete search history.

(56)   References Cited

U.S. PATENT DOCUMENTS

| 2019/0302917 | A1  | 10/2019 | Pan |
| 2020/0258864 | A1* | 8/2020  | Wang .................... H01L 25/167 |
| 2020/0328327 | A1  | 10/2020 | He et al. |
| 2023/0006095 | A1  | 1/2023  | Park et al. |

OTHER PUBLICATIONS

Jamal-Eddine, Zane et al., "Improved forward voltage and external quantum efficiency scaling in multi-active region III-nitride LEDs" (2021), Sandia National Laboratories, SAND2021-10196J (11 pages).

Li, Panpan et al., "Demonstration of high efficiency cascaded blue and green micro-light-emitting diodes with independent junction control", Appl. Phys. Lett. 118, 261104 (2021); doi: 10.1063/5.0054005 (4 pages).

Wang, Zhou et al., "Full-color micro-LED display based on a single chip with two types of InGaN/GaN MQWs" (2021), Optics Letters 46(17), Sep. 1, 2021 (4 pages).

* cited by examiner

NDA: PHA, PDA1, CVA1, PDA2, CVA2

DISPLAY DEVICE HAVING A PLURALITY OF ACTIVE LAYERS WITH DIFFERENT MATERIALS AND METHOD OF MANUFACTURING THE SAME

CROSS-REFERENCE TO RELATED APPLICATION

This application is a continuation of U.S. patent application Ser. No. 17/855,251, filed Jun. 30, 2022, which claims priority to and the benefit of Korean Patent Application No. 10-2021-0135760 filed on Oct. 13, 2021, in the Korean Intellectual Property Office (KIPO), the entire content of which is incorporated by reference herein.

BACKGROUND

1. Field

One or more embodiments of the present disclosure relate to a display device and a method of manufacturing the same.

2. Description of the Related Art

With the advancement of the information society, the demand for a display device in various forms and for displaying an image is increasing. A display device may be a flat panel display device such as a liquid crystal display device, a field emission display device, and/or a light-emitting display panel. A light-emitting display device may include an organic light-emitting display device including an organic light-emitting diode element as a light-emitting element, an inorganic light-emitting display device including an inorganic semiconductor element as a light-emitting element, or an ultra-small light-emitting diode element (or micro light-emitting diode element) as a light-emitting element.

Recently, a head mounted display including a light-emitting display device has been developed. The head mounted display (HMD) is a spectacle-type monitor device of virtual reality (VR) and/or augmented reality, for example worn in a form of glasses or a helmet to form a focus point at a distance close to user's eyes.

A high-resolution ultra-small light-emitting diode display panel including a micro light-emitting diode element is applied to the HMD. When the ultra-small light-emitting diode element emits light of a single color, in order for an ultra-small light-emitting diode display panel to display various colors, a wavelength conversion layer that converts a wavelength of light emitted from the ultra-small light-emitting diode element may be essential (e.g., may be needed).

SUMMARY

Aspects and features of embodiments of the present disclosure include a display device that does not require a wavelength conversion layer by including an ultra-small light-emitting diode element emitting (e.g., configured to emit) light of a red wavelength band, an ultra-small light-emitting diode element emitting (e.g., configured to emit) light of a green wavelength band, and an ultra-small light-emitting diode element emitting (e.g., configured to emit) light of a blue wavelength band, and a method of manufacturing the same.

However, embodiments of the present disclosure are not limited to those set forth herein. The above and other embodiments of the present disclosure will become more apparent to one of ordinary skill in the art to which the present disclosure pertains by referencing the detailed description of the present disclosure given below.

According to one or more embodiments of the present disclosure, there is provided a display device including a substrate, a plurality of pixel electrodes provided on the substrate and spaced apart from each other, a plurality of light-emitting elements on the plurality of pixel electrodes, respectively, and a common electrode layer on the plurality of light-emitting elements and to which a common voltage is applied. The plurality of light-emitting elements include a first light-emitting element that is configured to emit first light according to a first driving current and a second light-emitting element that is configured to emit second light according to a second driving current. An active layer of the first light-emitting element is the same as an active layer of the second light-emitting element.

A content of indium in the active layer of the first light-emitting element and a content of indium in the active layer of the second light-emitting element may be in a range from 30% to 45%.

A current density of the first driving current may be lower than a current density of the second driving current.

A first peak current value of the first driving current may be lower than a second peak current value of the second driving current.

A current density of the first driving current may be the same regardless of a gray level of the first light-emitting element, and a current density of the second driving current may be the same regardless of a gray level of the second light-emitting element.

An application period of the first driving current may be adjusted according to the gray level of the first light-emitting element, and an application period of the second driving current may be adjusted according to the gray level of the second light-emitting element.

The application period of the first driving current when the first light-emitting element is to emit light with a peak white gray level may be longer than the application period of the second driving current when the second light-emitting element is to emit light with a peak white gray level.

During one frame period, the application period of the first driving current may be repeated a plurality of times, and the application period of the second driving current may be repeated a plurality of times.

During the one frame period, a sum of the application periods of the first driving current may be longer than a sum of the application periods of the second driving current.

The plurality of light-emitting elements may further include a third light-emitting element that is configured to emit third light according to a third driving current, and an active layer of the third light-emitting element may be different from the active layer of the first light-emitting element and the active layer of the second light-emitting element.

A content of indium in the active layer of the third light-emitting element may be smaller than a content of indium in the active layer of the first light-emitting element and a content of indium in the active layer of the second light-emitting element.

A current density of the third driving current may be adjusted according to a gray level of the third light-emitting element.

According to one or more embodiments of the present disclosure, there is provided a display device including a substrate, a plurality of pixel electrodes on the substrate and spaced apart from each other, a plurality of light-emitting elements respectively on the plurality of pixel electrodes, and a common electrode layer on the plurality of light-emitting elements and to which a common voltage is applied. The plurality of light-emitting elements include a first light-emitting element that is configured to emit first light according to a first driving current, a second light-emitting element that is configured to emit second light according to a second driving current, and a third light-emitting element that is configured to emit third light according to a third driving current. A current density of the first driving current is the same regardless of a gray level of the first light-emitting element, and a current density of the second driving current is the same regardless of a gray level of the second light-emitting element. A current density of the third driving current is adjusted according to a gray level of the third light-emitting element.

The current density of the first driving current may be lower than the current density of the second driving current.

An active layer of the first light-emitting element may be the same as an active layer of the second light-emitting element.

A content of indium in an active layer of the third light-emitting element may be smaller than a content of indium in the active layer of the first light-emitting element and a content of indium in the active layer of the second light-emitting element.

According to one or more embodiments of the present disclosure, there is provided a method of manufacturing a display device, the method including forming a common electrode layer on a substrate, forming a hard mask on the common electrode layer, forming a plurality of first openings exposing the common electrode layer by etching the hard mask, forming first light-emitting elements in some first openings of the plurality of first openings, respectively, and forming second light-emitting elements in remaining first openings of the plurality of first openings, respectively, forming a mask pattern covering the first light-emitting elements and the second light-emitting elements, forming a plurality of second openings exposing the common electrode layer by etching the hard mask, and forming third light-emitting elements in the plurality of second openings, respectively.

A content of indium in an active layer of the third light-emitting element may be smaller than a content of indium in an active layer of the first light-emitting element and a content of indium in an active layer of the second light-emitting element.

A content of indium in the active layer of the first light-emitting element and a content of indium in the active layer of the second light-emitting element may be in a range from 30% to 45%.

The method may further include removing the hard mask and the mask pattern, forming first connection electrodes on the first light-emitting elements, the second light-emitting elements, and the third light-emitting elements, respectively, and forming second connection electrodes on pixel electrodes of a semiconductor circuit board, respectively, and bonding the first connection electrodes and the second connection electrodes.

According to the aforementioned and other embodiments of the present disclosure, each of a plurality of pixels includes a first light-emitting element configured to emit first light, a second light-emitting element configured to emit second light, and a third light-emitting element configured to emit third light, and thus various colors can be displayed without a wavelength conversion layer.

According to the aforementioned and other embodiments of the present disclosure, even though a first light-emitting layer of a first light-emitting element and a first light-emitting layer of a second light-emitting element are formed of the same material, the first light-emitting element can emit first light and the second light-emitting element can emit second light by making the current density of a second driving current applied to the second light-emitting element higher than the current density of a first driving current applied to the first light-emitting element.

According to the aforementioned and other embodiments of the present disclosure, first light-emitting elements, second light-emitting elements, and fourth light-emitting elements may be simultaneously (or concurrently) formed of the same material, so that a manufacturing process can be simplified and manufacturing cost can be reduced as compared with a case in which the first light-emitting elements, the second light-emitting elements, and the fourth light-emitting elements are separately formed.

BRIEF DESCRIPTION OF THE DRAWINGS

The above and other embodiments and features of the present disclosure will become more apparent by describing embodiments thereof with reference to the attached drawings, in which.

DETAILED DESCRIPTION

Figure 1:
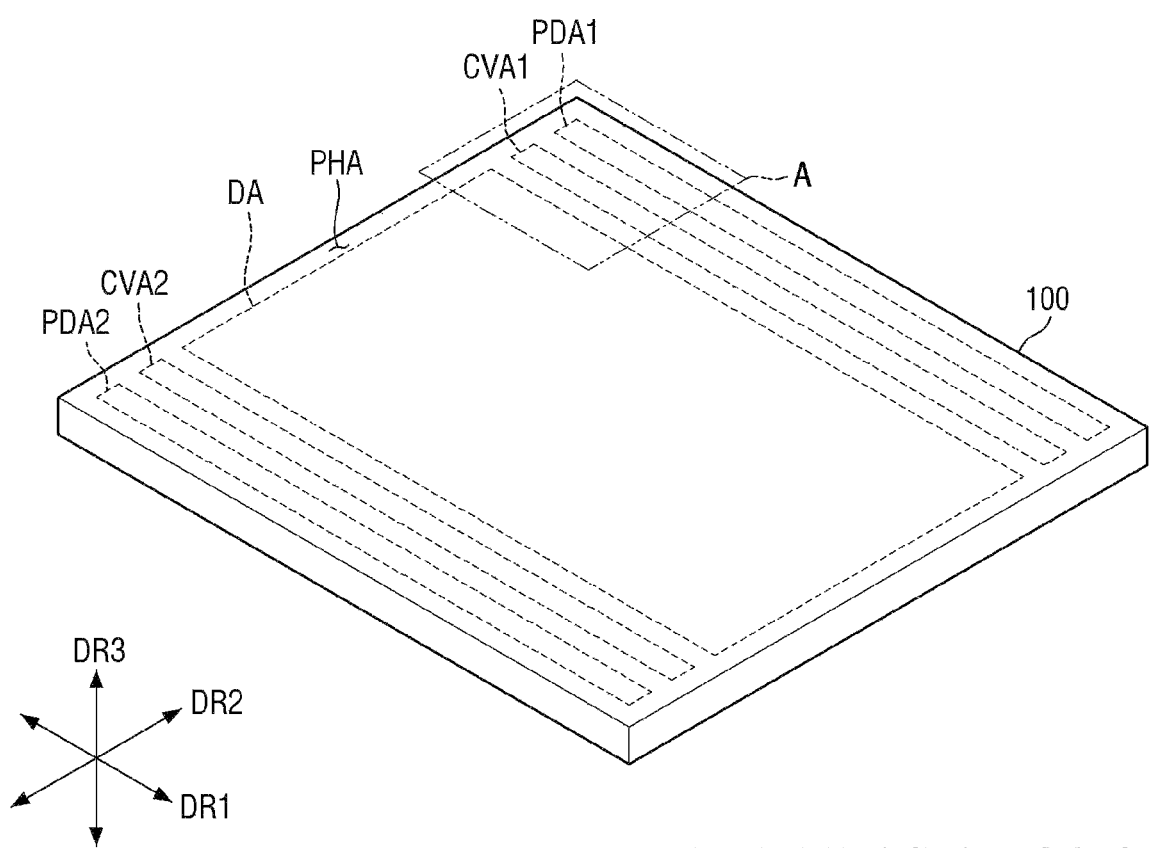
FIG. 1 is a perspective view showing a display device according to one or more embodiments.

Aspects and features of some embodiments of the present disclosure and methods of accomplishing the same may be understood more readily by reference to the detailed description of embodiments and the accompanying drawings. Hereinafter, embodiments will be described in more detail with reference to the accompanying drawings. The described embodiments, however, may be embodied in various different forms, and should not be construed as being limited to only the illustrated embodiments herein. Rather, these embodiments are provided as examples so that this disclosure will be thorough and complete, and will fully convey the aspects and features of embodiments of the present disclosure to those skilled in the art. Accordingly, processes, elements, and techniques that are not necessary to those having ordinary skill in the art for a complete understanding of the aspects and features of embodiments of the present disclosure might not be described.

Unless otherwise noted, like reference numerals, characters, or combinations thereof denote like elements throughout the attached drawings and the written description, and thus, redundant descriptions thereof will not be repeated. Further, parts not related to the description of some embodiments might not be shown to make the description clear.

In the drawings, the relative sizes of elements, layers, and regions may be exaggerated for clarity. Additionally, the use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified.

Various embodiments are described herein with reference to sectional illustrations that are schematic illustrations of embodiments and/or intermediate structures. As such, variations from the shapes of the illustrations as a result, for example, of manufacturing techniques and/or tolerances, are to be expected. Further, specific structural or functional descriptions disclosed herein are merely illustrative for the purpose of describing embodiments according to the concept as well as aspects and features of embodiments of the present disclosure. Thus, embodiments disclosed herein should not be construed as limited to the particular illustrated shapes of regions, but are to include deviations in shapes that result from, for instance, manufacturing.

For example, an implanted region illustrated as a rectangle may have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the drawings are schematic in nature and their shapes are not intended to illustrate the actual shape of a region of a device and are not intended to be limiting. Additionally, as those skilled in the art would realize, the described embodiments may be modified in various different ways, all without departing from the spirit or scope of the present disclosure.

In the detailed description, for the purposes of explanation, numerous specific details are set forth to provide a thorough understanding of various embodiments. It is apparent, however, that various embodiments may be practiced without these specific details or with one or more equivalent arrangements. In other instances, well-known structures and devices are shown in block diagram form in order to avoid unnecessarily obscuring various embodiments.

Spatially relative terms, such as "beneath," "below," "lower," "under," "above," "upper," and the like, may be used herein for ease of explanation to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly. Similarly, when a first part is described as being arranged "on" a second part, this indicates that the first part is arranged at an upper side or a lower side of the second part without the limitation to the upper side thereof on the basis of the gravity direction.

Further, in this specification, the phrase "on a plane," or "in a plan view," means viewing a target portion from the top, and the phrase "on a cross-section" means viewing a cross-section formed by vertically cutting a target portion from the side.

It will be understood that when an element, layer, region, or component is referred to as being "formed on," "on," "connected to," or "coupled to" another element, layer, region, or component, it can be directly formed on, on, connected to, or coupled to the other element, layer, region, or component, or indirectly formed on, on, connected to, or coupled to the other element, layer, region, or component such that one or more intervening elements, layers, regions, or components may be present. For example, when a layer, region, or component is referred to as being "electrically connected" or "electrically coupled" to another layer, region, or component, it can be directly electrically connected or coupled to the other layer, region, and/or component or intervening layers, regions, or components may be present. However, "directly connected/directly coupled" refers to one component directly connecting or coupling another component without an intermediate component there between. Other expressions describing relationships between components such as "between," "immediately between" or "adjacent to" and "directly adjacent to" may be construed similarly. In addition, it will also be understood that when an element or layer is referred to as being "between" two elements or layers, it can be the only element or layer between the two elements or layers, or one or more intervening elements or layers may also be present.

For the purposes of this disclosure, expressions such as "at least one of," when preceding a list of elements, modify the entire list of elements and do not modify the individual elements of the list. For example, "at least one of X, Y, and Z," "at least one of X, Y, or Z," and "at least one selected from the group consisting of X, Y, and Z" may be construed as X only, Y only, Z only, any combination of two or more of X, Y, and Z, such as, for instance, XYZ, XYY, YZ, and ZZ, or any variation thereof. Similarly, the expressions such as "at least one of A and B" and "at least one of A or B," may include A, B, or A and B. As used herein, the term "and/or" includes any and all combinations of one or more of the associated listed items. For example, the expression such as "A and/or B" may include A, B, or A and B.

It will be understood that, although the terms "first," "second," "third," etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present disclosure.

In the examples, the x-axis, the y-axis, and/or the z-axis are not limited to three axes of a rectangular coordinate system, and may be interpreted in a broader sense. For example, the x-axis, the y-axis, and the z-axis may be normal or perpendicular (e.g., substantially perpendicular) to one another, or may represent different directions that are not perpendicular to one another. The same applies for first, second, and/or third directions.

The terminology used herein is for the purpose of describing particular embodiments only and is not intended to be limiting of the present disclosure. As used herein, the singular forms "a" and "an" are intended to include the plural forms as well, unless the context clearly indicates otherwise. It will be further understood that the terms "comprises," "comprising," "have," "having," "includes," and "including," when used in this specification, specify the presence of the stated features, integers, steps, operations, elements, and/or components, but do not preclude the presence or addition of one or more other features, integers, steps, operations, elements, components, and/or groups thereof.

As used herein, the term "substantially," "about," "approximately," and similar terms are used as terms of approximation and not as terms of degree, and are intended to account for the inherent deviations in measured or calculated values that would be recognized by those of ordinary skill in the art. "About" or "approximately," as used herein, is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value. Further, the use of "may" when describing embodiments of the present disclosure refers to "one or more embodiments of the present disclosure."

When one or more embodiments may be implemented differently, a specific process order may be performed differently from the described order. For example, two consecutively described processes may be performed substantially at the same time or performed in an order opposite to the described order.

Also, any numerical range disclosed and/or recited herein is intended to include all sub-ranges of the same numerical precision subsumed within the recited range. For example, a range of "1.0 to 10.0" is intended to include all subranges between (and including) the recited minimum value of 1.0 and the recited maximum value of 10.0, For example, having a minimum value equal to or greater than 1.0 and a maximum value equal to or less than 10.0, such as, for example, 2.4 to 7.6. Any maximum numerical limitation recited herein is intended to include all lower numerical limitations subsumed therein, and any minimum numerical limitation recited in this specification is intended to include all higher numerical limitations subsumed therein. Accordingly, Applicant reserves the right to amend this specification, including the claims, to expressly recite any sub-range subsumed within the ranges expressly recited herein. All such ranges are intended to be inherently described in this specification such that amending to expressly recite any such subranges would comply with the requirements of 35 U.S.C. § 112(a) and 35 U.S.C. § 132(a).

The electronic or electric devices and/or any other relevant devices or components according to one or more embodiments of the present disclosure described herein may be implemented utilizing any suitable hardware, firmware (e.g. an application-specific integrated circuit), software, or a combination of software, firmware, and hardware. For example, the various components of these devices may be formed on one integrated circuit (IC) chip or on separate IC chips. Further, the various components of these devices may be implemented on a flexible printed circuit film, a tape carrier package (TCP), a printed circuit board (PCB), or formed on one substrate.

Further, the various components of these devices may be a process or thread, running on one or more processors, in one or more computing devices, executing computer program instructions and interacting with other system components for performing the various functionalities described herein. The computer program instructions are stored in a memory which may be implemented in a computing device using a standard memory device, such as, for example, a random access memory (RAM). The computer program instructions may also be stored in other non-transitory computer readable media such as, for example, a CD-ROM, flash drive, or the like. Also, a person of skill in the art should recognize that the functionality of various computing devices may be combined or integrated into a single computing device, or the functionality of a particular computing device may be distributed across one or more other computing devices without departing from the spirit and scope of the present disclosure.

Unless otherwise defined, all terms (including technical and scientific terms) used herein have the same meaning as commonly understood by one of ordinary skill in the art to which the present disclosure belongs. It will be further understood that terms, such as those defined in commonly used dictionaries, should be interpreted as having a meaning For example consistent with their meaning in the context of the relevant art and/or the present specification, and should not be interpreted in an idealized or overly formal sense, unless expressly so defined herein.

Figure 2:
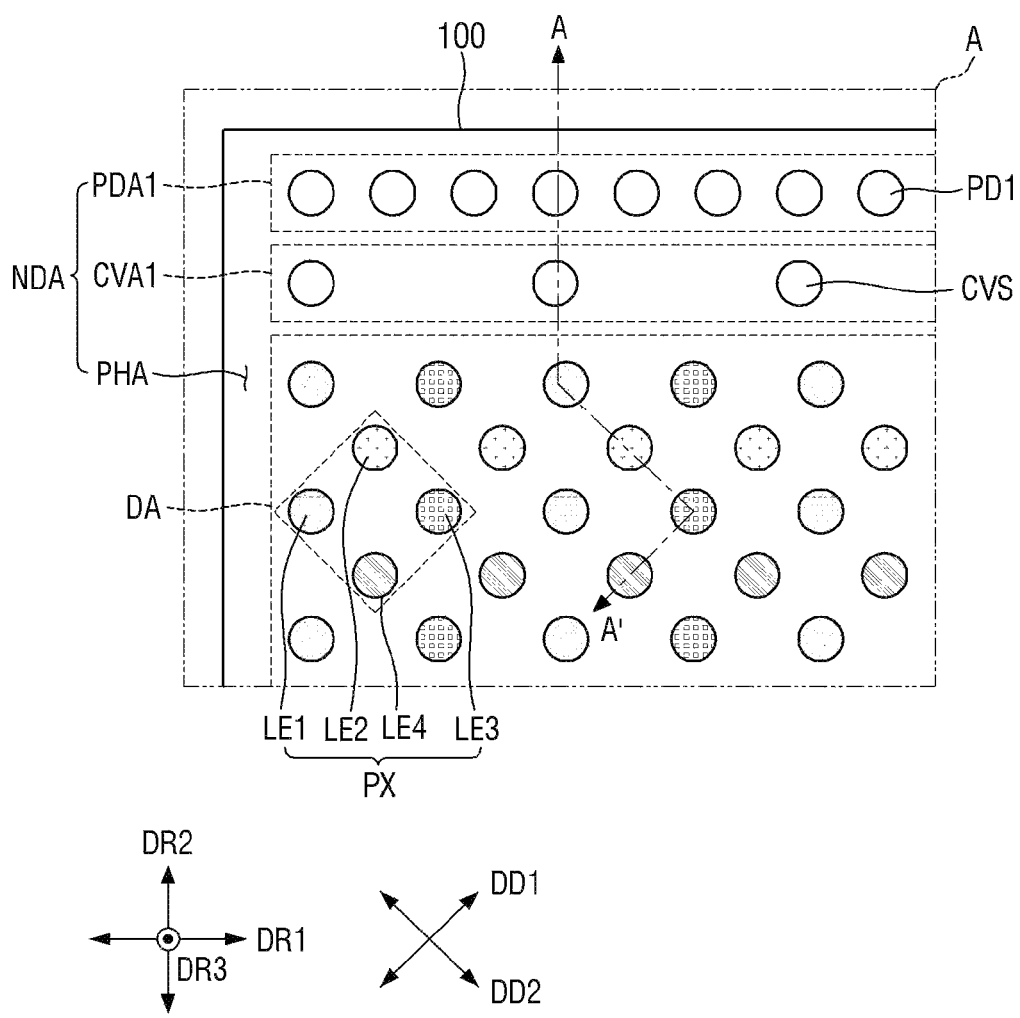
FIG. 2 is a layout view showing an example of region A in FIG. 1.

FIG. 1 is a perspective view showing a display device according to one or more embodiments. FIG. 2 is a layout view showing an example of region A in FIG. 1 in more detail.

In FIGS. 1 and 2, a description has been made focusing on that the display device according to one or more embodiments is an ultra-small light-emitting diode display device (micro or nano light-emitting diode display device) including an ultra-small light-emitting diode (micro or nano light-emitting diode) as a light-emitting element, but the embodiment of the present specification is not limited thereto.

In addition, in FIGS. 1 and 2, a description has been made focusing on that the display device according to one or more embodiments is a light-emitting diode on silicon (LEDoS) in which a light-emitting diode (LED) is provided as a light-emitting element on a semiconductor circuit board 101 formed by a semiconductor process using a silicon wafer, it should be noted that the embodiment of the present specification is not limited thereto.

In addition, in FIGS. 1 and 2, a first direction DR1 indicates a lateral direction of a display panel 100, a second direction DR2 indicates a longitudinal direction of the display panel 100, and a third direction DR3 indicates a thickness direction of the display panel 100 or a thickness direction of the semiconductor circuit board 101. In this case, "left", "right", "top", and "bottom" indicate directions when the display panel 100 is viewed from a plane. For example, "right side" is one side in the first direction DR1, "left side" is the other side in the first direction DR1, "upper side" is one side in the second direction DR2, and "lower side" is the other side in the second direction DR2. Further, "upper portion" indicates one side in the third direction DR3, and "lower portion" indicates the other side in the third direction DR3.

Referring to FIGS. 1 and 2, a display device 10 according to one or more embodiments includes a display panel 100 including a display region DA and a non-display region NDA.

The display panel 100 may have a quadrangular planar shape having long sides in the first direction DR1 and short sides in the second direction DR2. However, the planar shape of the display panel 100 is not limited thereto, and may have a polygonal shape other than the quadrangular shape, a circular shape, an elliptical shape, or an atypical planar shape.

The display region DA may be a region in which an image is displayed, and the non-display region NDA may be a region in which an image is not displayed. A planar shape of the display region DA may follow a planar shape of the display panel 100. In FIG. 1, it is exemplified that the planar shape of the display region DA has a quadrangular shape. The display region DA may be provided in a central region of the display panel 100. The non-display region NDA may be provided around the display region DA. The non-display region NDA may surround the display region DA.

The display region DA of the display panel 100 may include a plurality of pixels PX. The pixel PX may include a plurality of light-emitting elements, and may be defined as a minimum light-emitting unit capable of displaying white light by combining light emitted by the plurality of light-emitting elements.

Each of the plurality of pixels PX may include first to fourth light-emitting elements LE1, LE2, LE3, and LE4 that emit light.

The first light-emitting element LE1 may emit a first light. The first light may be light of a red wavelength band. For example, a main peak wavelength (R-peak) of the first light may be positioned at approximately 600 nm to 750 nm, but the embodiment of the present specification is not limited thereto.

The second light-emitting element LE2 and the fourth light-emitting element LE4 may emit a second light. The second light may be light of a green wavelength band. For example, a main peak wavelength (G-peak) of the second light may be positioned at approximately 480 nm to 560 nm, but the embodiment of the present specification is not limited thereto.

The third light-emitting element LE3 may emit a third light. The third light may be light of a blue wavelength band. For example, a main peak wavelength (B-peak) of the third light may be positioned at approximately 370 nm to 460 nm, but the embodiment of the present specification is not limited thereto.

In the display region DA, the first light-emitting elements LE1 and the third light-emitting elements LE3 may be alternately provided with each other in the first direction DR1 and may be repeatedly provided in the second direction DR2. In the display region DA, the second light-emitting elements LE2 and the fourth light-emitting elements LE4 may be repeatedly provided in the first direction DR1 and may be alternately provided with each other in the second direction DR2.

In the display region DA, the first light-emitting elements LE1, the second light-emitting elements LE2, the third light-emitting elements LE3, and the fourth light-emitting elements LE4 may be alternately provided in a first diagonal direction DD1 and a second diagonal direction DD2. In the display region DA, common connection portions CCT may be alternately provided in the first diagonal direction DD1 and the second diagonal direction DD2. The first diagonal direction DD1 may be a diagonal direction between the first direction DR1 and the second direction DR2, and the second diagonal direction DD2 may be a direction crossing (e.g., perpendicular to) the first diagonal direction DD1.

In each of the plurality of pixels PX, the first light-emitting element LE1 and the third light-emitting element LE3 may be arranged with each other in the first direction DR1, and the second light-emitting element LE2 and the fourth light-emitting element LE4 may be arranged with each other in the second direction DR2. In each of the plurality of pixels PX, the first light-emitting element LE1 and the second light-emitting element LE2 may be arranged with each other in the first diagonal direction DD1, the second light-emitting element LE2 and the third light-emitting element LE3 may be arranged with each other in the second diagonal direction DD2, and the third light-emitting element LE3 and the fourth light-emitting element LE4 may be arranged with each other in the first diagonal direction DD1.

The fourth light-emitting element LE4 may be substantially the same as the second light-emitting element LE2. For example, the fourth light-emitting element LE4 may emit the second light, and may have the same structure as the second light-emitting element LE2. The first light may be light of a red wavelength band, the second light may be light of a green wavelength band, the third light may be light of a blue wavelength band, and the fourth light may be light of a green wavelength band.

As shown in FIG. 2, an area of the first light-emitting element LE1, an area of the second light-emitting element LE2, an area of the third light-emitting element LE3, and an area of the fourth light-emitting element LE4 may be substantially the same, but the embodiment of the present specification is not limited thereto.

As shown in FIG. 2, a distance between the first light-emitting element LE1 and the second light-emitting element LE2 adjacent to each other, a distance between the second light-emitting element LE2 and the third light-emitting element LE3 adjacent to each other, a distance between the first light-emitting element LE1 and the fourth light-emitting element LE4 adjacent to each other, and a distance between the third light-emitting element LE3 and the fourth light-emitting element LE4 adjacent to each other may be substantially the same, but the embodiment of the present specification is not limited thereto. For example, the distance between the first light-emitting element LE1 and the second light-emitting element LE2 adjacent to each other and the distance between the second light-emitting element LE2 and the third light-emitting element LE3 adjacent to each other may be different from each other, and the distance between the first light-emitting element LE1 and the fourth light-emitting element LE4 adjacent to each other and the distance between the third light-emitting element LE3 and the fourth light-emitting element LE4 adjacent to each other may be different from each other. In this case, the distance between the first light-emitting element LE1 and the second light-emitting element LE2 adjacent to each other and the distance between the first light-emitting element LE1 and the fourth light-emitting element LE4 adjacent to each other may be substantially the same, and the distance between the second light-emitting element LE2 and the third light-emitting element LE3 adjacent to each other and the distance between the third light-emitting element LE3 and the fourth light-emitting element LE4 adjacent to each other may be substantially the same.

In one or more embodiments, the first light-emitting element LE1 is to emit the first light, the second light-emitting element LE2 and the fourth light-emitting element LE4 are to emit the second light, and the third light-emitting element LE3 is to emit the third light, but the embodiment of the present specification is not limited thereto. For example, the first light-emitting element LE1 may emit the first light, the second light-emitting element LE2 and the fourth light-emitting element LE4 may emit the third light, and the third light-emitting element LE3 may emit the second light. In one or more other embodiments, the first light-emitting element LE1 may emit the second light, the second light-emitting element LE2 and the fourth light-emitting element LE4 may emit the first light, and the third light-emitting element LE3 may emit the third light. In one or more other embodiments, the first light-emitting element LE1 may emit the first light, the second light-emitting element LE2 may emit the second light, the third light-emitting element LE3 may emit the third light, and the fourth light-emitting element LE4 may emit the fourth light. The fourth light may be light of a yellow wavelength band. For example, a main peak wavelength of the fourth light may be positioned at approximately 550 nm to 600 nm, but the embodiment of the present specification is not limited thereto.

In one or more embodiments, the first light-emitting element LE1, the second light-emitting element LE2, the third light-emitting element LE3, and the fourth light-emitting element LE4 may have a circular planar shape, but the embodiment of the present specification is not limited thereto. For example, the first light-emitting element LE1, the second light-emitting element LE2, the third light-emitting element LE3, and the fourth light-emitting element LE4 may have polygonal shapes such as a triangle shape, a quadrangular shape, a pentagonal shape, a hexagonal shape, and/or an octagonal shape, an elliptical shape, and/or an atypical shape.

The non-display region NDA may include a first common voltage supply region CVA1, a second common voltage supply region CVA2, a first pad portion PDA1, a second pad portion PDA2, and a peripheral region PHA.

The first common voltage supply region CVA1 may be provided between the first pad region PDA1 and the display region DA. The second common voltage supply region CVA2 may be provided between the second pad region PDA2 and the display region DA. Each of the first common voltage supply region CVA1 and the second common voltage supply region CVA2 may include a plurality of common electrode connection portions CVS connected (e.g., electrically coupled) to a common electrode layer (e.g., CEL in FIG. 4). A common voltage may be supplied to the common electrode layer (e.g., CEL in FIG. 4) through the plurality of common electrode connection portions CVS.

The plurality of common electrode connection portions CVS of the first common voltage supply region CVA1 may be electrically connected to any one of first pads of the first pad region PDA1. For example, the plurality of common electrode connection portions CVS of the first common voltage supply region CVA1 may receive the common voltage from any one of the first pads of the first pad region PDA1.

The plurality of common electrode connection portions CVS of the second common voltage supply region CVA2 may be electrically connected to any one of second pads of the second pad region PDA2. For example, the plurality of common electrode connection portions CVS of the second common voltage supply region CVA2 may receive the common voltage from any one of the second pads of the second pad region PDA2.

The first pad region PDA1 may be provided at an upper side of the display panel 100. The first pad region PDA1 may include the first pads connected to an external circuit board.

The second pad region PDA2 may be provided at a lower side of the display panel 100. The second pad region PDA2 may include the second pads to be connected to the external circuit board. In some embodiments, the second pad region PDA2 may be omitted.

The peripheral region PHA may be a region in the non-display region NDA excluding the first common voltage supply region CVA1, the second common voltage supply region CVA2, the first pad portion PDA1, and the second pad portion PDA2. The peripheral region PHA may be provided to surround the first common voltage supply region CVA1, the second common voltage supply region CVA2, the first pad portion PDA1, and the second pad portion PDA2 as well as the display region DA.

Figure 3:
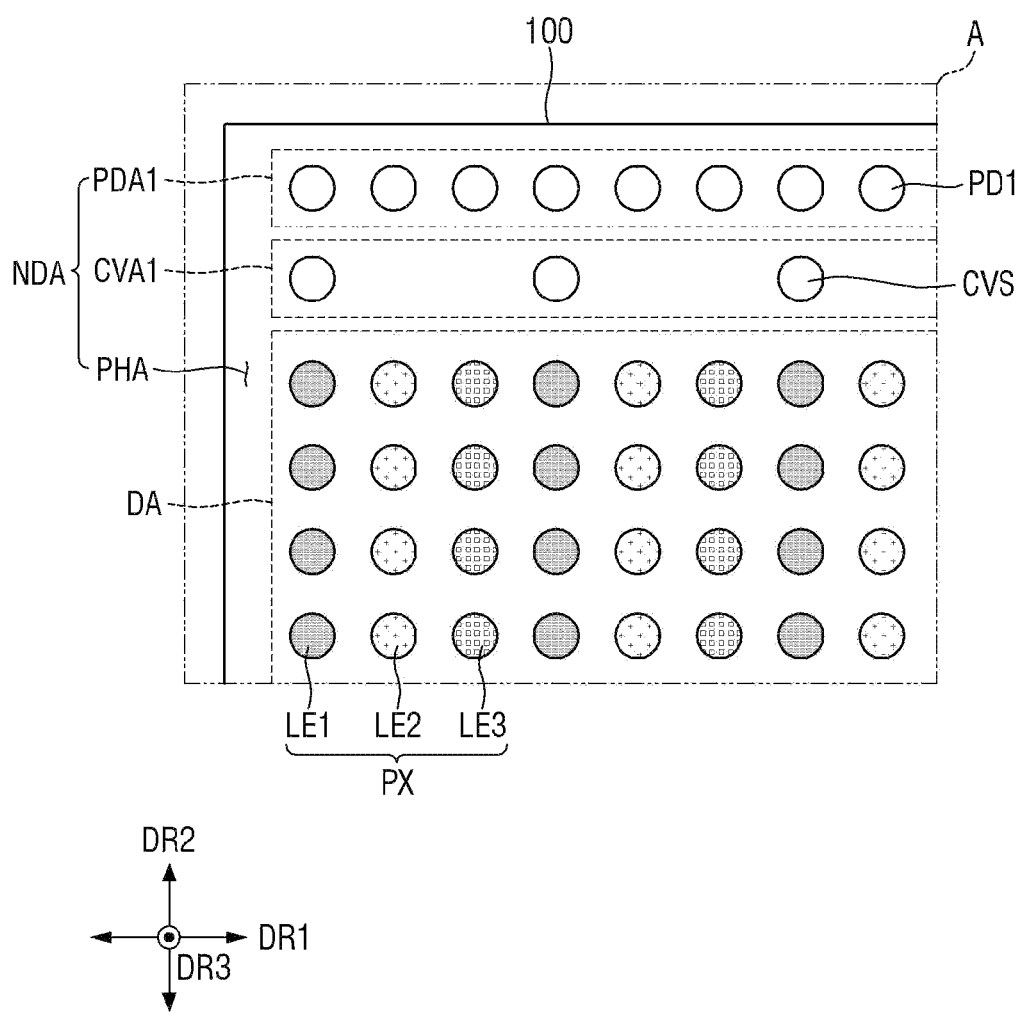
FIG. 3 is a layout view showing another example of region A in FIG. 1.

FIG. 3 is a layout view showing a display region of a display panel according to one or more embodiments.

FIG. 3 is different from the embodiment of FIG. 2 in that each of the plurality of pixels PX includes three light-emitting elements LE1, LE2, and LE3. In FIG. 3, differences from the embodiment of FIG. 2 will be mainly described.

Referring to FIG. 3, the first light-emitting elements LE1, the second light-emitting elements LE2, and the third light-emitting elements LE3 may be alternately arranged with each other in the first direction DR1. For example, the first light-emitting elements LE1, the second light-emitting elements LE2, and the third light-emitting elements LE3 may be provided in the order of the first light-emitting element LE1, the second light-emitting element LE2, and the third light-emitting element LE3 in the first direction DR1. For example, the first light-emitting element LE1, the second light-emitting element LE2, and the third light-emitting element LE3 in each of the plurality of pixels PX may be arranged in the first direction DR1.

The first light-emitting elements LE1 may be arranged with each other in the second direction DR2. The second light-emitting elements LE2 may be arranged with each other in the second direction DR2. The third light-emitting elements LE3 may be arranged with each other in the second direction DR2.

Although it is exemplified that each of the plurality of pixels PX includes four light-emitting elements LE1, LE2, LE3 and LE4 in FIG. 2 and each of the plurality of pixels PX includes three light-emitting elements LE1, LE2, and LE3 in FIG. 3, the number of light-emitting elements of each of the plurality of pixels PX is not limited thereto in the embodiments of the present specification.

Figure 4:
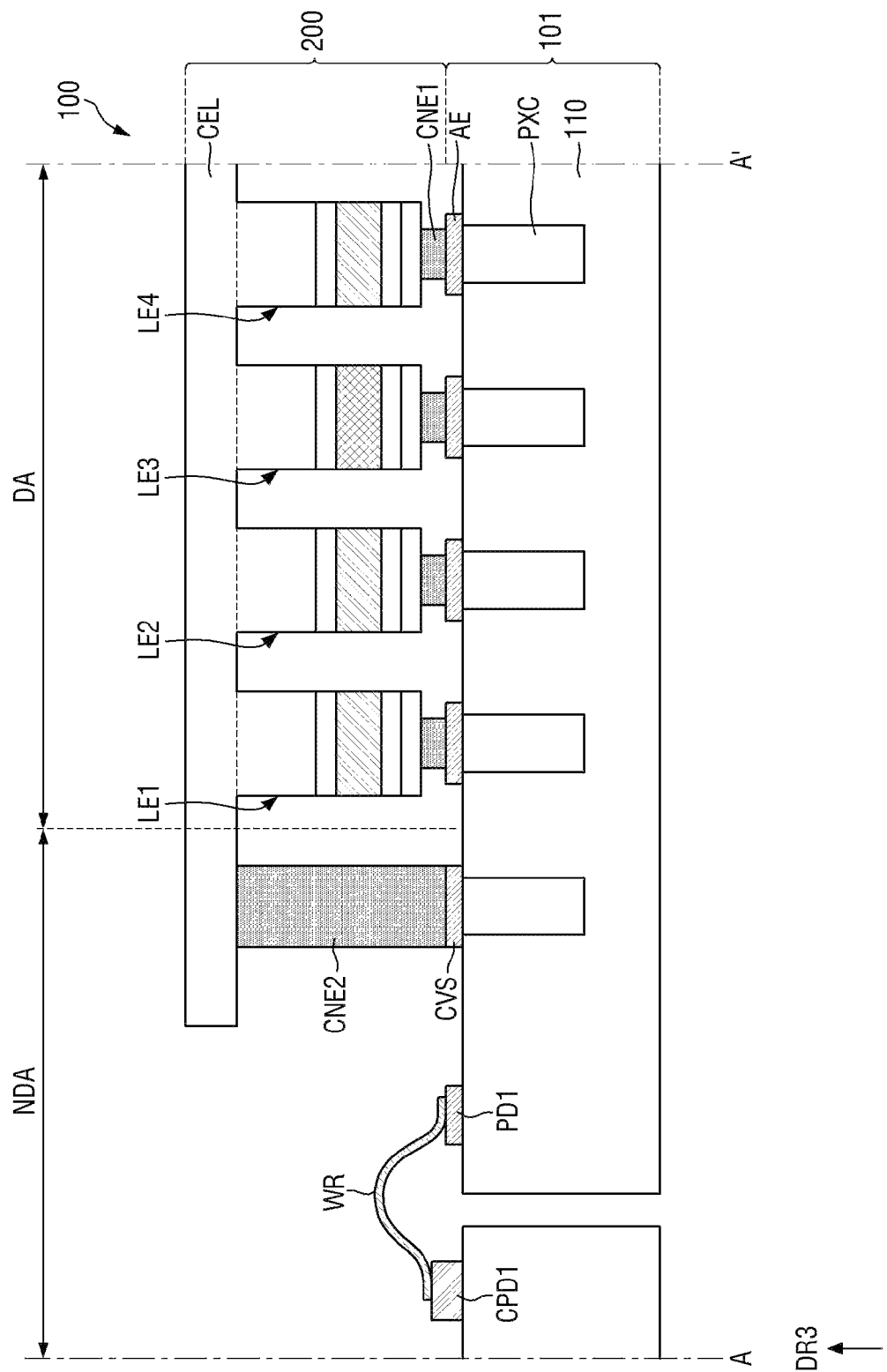
FIG. 4 is a cross-sectional view showing an example of a display panel taken along line A-A' in FIG. 2.
Figure 5:
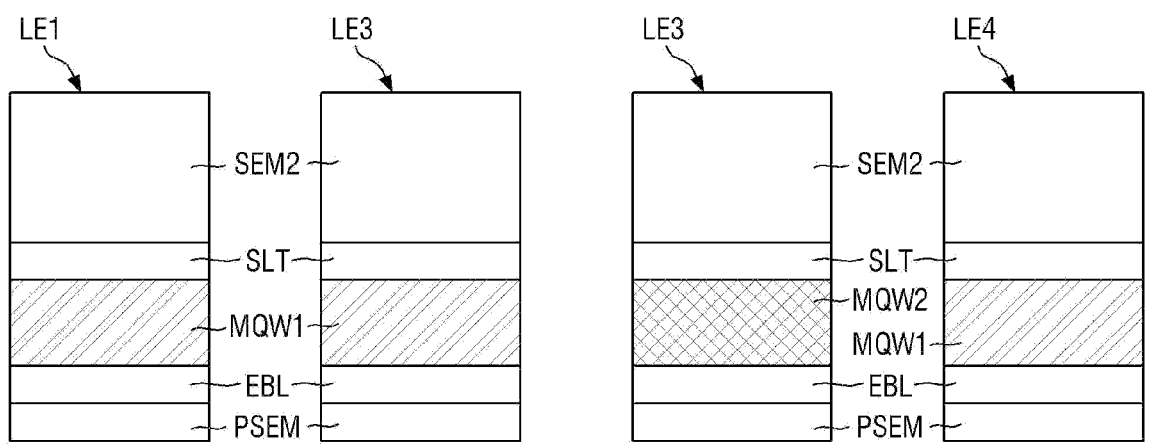
FIG. 5 is a cross-sectional view showing first to fourth light-emitting elements of FIG. 4 in more detail.

FIG. 4 is a cross-sectional view showing an example of the display panel taken along line A-A' in FIG. 2. FIG. 5 is a cross-sectional view showing first to fourth light-emitting elements of FIG. 4 in more detail.

Referring to FIGS. 4 and 5, the display panel 100 according to one or more embodiments may include a semiconductor circuit board 101 and a light-emitting element layer 200.

The semiconductor circuit board 101 may include a first substrate 110, a plurality of pixel circuit units PXC, pixel electrodes AE, a common electrode connection portion CVS, and a first pad PD1.

The first substrate 110 may be a silicon wafer substrate. The first substrate 110 may be formed of single crystal silicon.

Each of the plurality of pixel circuit units PXC may be provided on the first substrate 110. Each of the plurality of pixel circuit units PXC may include a complementary metal-oxide semiconductor (CMOS) circuit formed using a suitable semiconductor process. Each of the plurality of pixel circuit units PXC may include at least one transistor formed by a suitable semiconductor process. In some embodiments, each of the plurality of pixel circuit units PXC may further include at least one capacitor formed by a suitable semiconductor process.

The plurality of pixel circuit units PXC may be provided in the display region DA. Each of the pixel circuit units PXC provided in the display region DA among the plurality of pixel circuit units PXC may be electrically connected to the pixel electrode AE corresponding thereto. For example, the plurality of pixel circuit units PXC and the plurality of pixel electrodes AE may be connected in a one-to-one correspondence. Each of the plurality of pixel circuit units PXC may apply a pixel voltage to the pixel electrode AE.

The plurality of pixel electrodes AE may be provided in the display region DA. Each of the plurality of pixel electrodes AE may be provided on the pixel circuit unit PXC corresponding thereto. Each of the pixel electrodes AE may be an exposed electrode integrally formed with the pixel circuit unit PXC and exposed from the pixel circuit unit PXC (e.g., from the interface between the pixel electrode AE and the pixel circuit unit PXC). For example, each of the pixel electrodes AE may protrude from an upper surface of the pixel circuit unit PXC. Each of the pixel electrodes AE may receive the pixel voltage from the pixel circuit unit PXC. The pixel electrodes AE may include a metal material such as aluminum (Al).

The plurality of common electrode connection portions CVS may be provided in common electrode regions CPA1 and CPA2 of the non-display region NDA. Each of the plurality of common electrode connection portions CVS may be provided on the pixel circuit unit PXC corresponding thereto. The common electrode connection portion CVS may be an exposed electrode formed integrally with the pixel circuit unit PXC and exposed from the pixel circuit unit PXC (e.g., from the interface between the common electrode connection portion CVS and the pixel circuit unit PXC). For example, each of the common electrode connection portions CVS may protrude from an upper surface of the pixel circuit unit PXC. The common electrode connection portion CVS may include a metal material such as aluminum (Al).

A plurality of first pads PD1 may be provided in the first pad region PDA1 of the non-display region NDA. Each of the plurality of first pads PD1 may be connected to a circuit pad CPD1 of a circuit board 700 through a conductive connection member such as a wire WR. For example, the first pad PD1 and the circuit pad CPD1 of the circuit board 700 may be electrically connected to each other through the wire WR.

In one or more embodiments, the semiconductor circuit board 101 and the circuit board 700 may be provided on a separate lower substrate. The semiconductor circuit board 101 and the circuit board 700 may be attached to an upper surface of the lower substrate using an adhesive member such as a pressure sensitive adhesive.

The circuit board 700 may be a flexible printed circuit board (FPCB), a printed circuit board (PCB), a flexible printed circuit (FPC), and/or a flexible film such as a chip on film (COF).

The light-emitting element layer 200 may include light-emitting elements LE1, LE2, LE3, and LE4, a common electrode layer CEL, and connection electrodes CNE1 and CNE2.

Each of the light-emitting elements LE1, LE2, LE3, and LE4 may be provided on the pixel electrode AE corresponding thereto. Each of the light-emitting elements LE1, LE2, LE3, and LE4 may extend in the third direction DR3 (e.g., a thickness direction of the first substrate 110). A length of each of the light-emitting elements LE1, LE2, LE3, and LE4 in the third direction DR3 may be greater than a length in a horizontal direction. The length in the horizontal direction may be a length in the first direction DR1 or the second direction DR2. As an example, a length of each of the light-emitting elements LE1, LE2, LE3, and LE4 in the third direction DR3 may be about 1 μm to 5 μm. Each of the light-emitting elements LE1, LE2, LE3, and LE4 may have a cylindrical shape, a disk shape, and/or a rod shape with a width greater than a height (e.g., a length is larger than a thickness). However, the embodiment is not limited thereto, and each of the light-emitting elements LE1, LE2, LE3, and LE4 may have a shape of a rod, a wire, a tube, etc., a polygonal prism shape such as a cubic shape, a rectangular parallelepiped shape, and/or a hexagonal prism shape, and/or various suitable shapes such as a shape extending in one direction and having an outer surface partially inclined.

According to one or more embodiments, each of the light-emitting elements LE1, LE2, LE3, and LE4 may include a first semiconductor layer PSEM, an electron blocking layer EBL, an active layer MQW1 or MQW2, a superlattice layer SLT, and a second semiconductor layer NSEM. The first semiconductor layer PSEM, the electron blocking layer EBL, the active layers MQW1/MQW2, the superlattice layer SLT, and the second semiconductor layer NSEM may be sequentially stacked in the third direction DR3.

The first semiconductor layer PSEM may be a p-type semiconductor and may include a semiconductor material having a chemical formula of $Al_xGa_yIn_{1-x-y}N$ ($0 \leq x \leq 1$, $0 \leq y \leq 1$, $0 \leq x+y \leq 1$). For example, the first semiconductor layer PSEM may be one or more of AlGaInN, GaN, AlGaN, InGaN, AlN, or InN doped with a p-type dopant. The first semiconductor layer PSEM may be doped with a p-type dopant, and the p-type dopant may include Mg, Zn, Ca, Ba, and/or the like. For example, the first semiconductor layer PSEM may be p-GaN doped with Mg that is the p-type dopant. The first semiconductor layer PSEM may have a thickness in a range from about 30 nm to about 200 nm.

The electron blocking layer EBL may be provided on the first semiconductor layer PSEM. The electron blocking layer EBL may prevent or reduce the injection of electrons flowing into the active layers MQW1/MQW2 into another layer without recombination with holes in the active layers MQW1/MQW2. For example, the electron blocking layer EBL may be p-AlGaN doped with Mg that is the p-type dopant. A thickness of the electron blocking layer EBL may be in a range from about 10 nm to about 50 nm, but the embodiment is not limited thereto. In some embodiments, the electron blocking layer EBL may not be provided.

The active layers MQW1/MQW2 may be provided on the electron blocking layer EBL. The active layers MQW1/MQW2 may emit light by recombination of electrons and holes according to an emission signal applied through the first semiconductor layer PSEM and the second semiconductor layer NSEM. The active layers MQW1/MQW2 may include a material having a single or multiple quantum well structure. When the active layers MQW1/MQW2 include a material having a multiple quantum well structure, the active layers MQW1/MQW2 may have a quantum well structure in which a plurality of well layers and barrier layers are alternately stacked. In this case, the well layer may be formed of InGaN, and the barrier layer may be formed of GaN and/or AlGaN, but the embodiment is not limited thereto. For example, the active layers MQW1/MQW2 may have a structure in which a semiconductor material having large band gap energy and a semiconductor material having small band gap energy are alternately stacked, and may include other Group III to V semiconductor materials depending on the wavelength band of the emitted light.

The superlattice layer SLT is provided on the active layers MQW1/MQW2. The superlattice layer SLT may relieve stress due to a difference in lattice constant between the second semiconductor layer NSEM and the active layers MQW1/MQW2. For example, the superlattice layer SLT may be formed of InGaN and/or GaN. A thickness of the superlattice layer SLT may be approximately 50 nm to 200 nm. However, the superlattice layer SLT may not be provided.

The second semiconductor layer NSEM may be provided on the superlattice layer SLT. The second semiconductor layer NSEM may be an n-type semiconductor. The second semiconductor layer NSEM may include a semiconductor material having a chemical formula of $Al_xGa_yIn_{1-x-y}N$ ($0 \leq x \leq 1$, $0 \leq y \leq 1$, $0 \leq x+y \leq 1$). For example, the second semiconductor layer NSEM may be one or more of AlGaInN, GaN, AlGaN, InGaN, AlN, or InN doped with an n-type dopant. The second semiconductor layer NSEM may be doped with an n-type dopant, and the n-type dopant may include Si, Ge, Sn, and/or the like. For example, the second semiconductor layer NSEM may be n-GaN doped with Si that is the n-type dopant. A thickness of the second semiconductor layer NSEM may be in a range from about 500 nm to about 1 µm, but the embodiment is not limited thereto.

According to one or more embodiments, each of the first light-emitting elements LE1, the second light-emitting elements LE2, and the fourth light-emitting elements LE4 may include a first active layer MQW1, and the third light-emitting elements LE3 may include a second active layer MQW2. When the active layers MQW1/MQW2 are formed of InGaN, a color of light emitted from the active layers MQW1/MQW2 may be changed depending on the content of indium (In). For example, as the content of indium (In) increases, a wavelength band of light emitted from the active layer may move to the red wavelength band, and as the content of indium (In) decreases, the wavelength band of light emitted from the active layer may move to the blue wavelength band. The content of indium (In) in the first active layer MQW1 may be greater than the content of indium (In) in the second active layer MQW2. For example, the content of indium (In) in the first active layer MQW1 may be approximately 30% to 45%, and the content of indium (In) in the second active layer MQW2 may be approximately 10% to 20%. In this case, the first active layer MQW1 may emit the first light or the second light depending on a current density, and the second active layer MQW2 may emit the third light.

It is exemplified in FIG. 4 that each of the light-emitting elements LE1, LE2, LE3, and LE4 has the same (or substantially the same) top and bottom widths and has a rectangular cross-sectional shape, but the embodiment of the present specification is not limited thereto. For example, the top width of each of the light-emitting elements LE1, LE2, LE3, and LE4 may be greater than the bottom width thereof. For example, each of the light-emitting elements LE1, LE2, LE3, and LE4 may have a trapezoidal cross-sectional shape. In this case, because an area of the active layer MQW1 or MQW2 of each of the light-emitting elements LE1, LE2, LE3, and LE4 is increased, an amount of light emitted from each of the light-emitting elements LE1, LE2, LE3, and LE4 may be increased.

The common electrode layer CEL may be provided on the light-emitting elements LE1, LE2, LE3, and LE4. The common electrode layer CEL may be connected to the second semiconductor layer NSEM of each of the light-emitting elements LE1, LE2, LE3, and LE4 as one common layer.

The common electrode layer CEL may be an n-type semiconductor including the same material as the second semiconductor layer NSEM. The common electrode layer CEL may include a semiconductor material having a chemical formula of $Al_xGa_yIn_{1-x-y}N$ ($0 \leq x \leq 1$, $0 \leq y \leq 1$, $0 \leq x+y \leq 1$). For example, the common electrode layer CEL may be one or more of AlGaInN, GaN, AlGaN, InGaN, AlN, or InN doped with an n-type dopant. The common electrode layer CEL may be doped with an n-type dopant, and the n-type dopant may include Si, Ge, Sn, and/or the like. For example, the common electrode layer CEL may be n-GaN doped with Si that is the n-type dopant.

As described above, the common electrode layer CEL may be formed of the same material as the second semiconductor layer NSEM and is integrated with the second semiconductor layer NSEM (see e.g., FIG. 4), but the embodiment is not limited thereto. In some embodiments, the common electrode layer CEL may be formed of a material different from that of the second semiconductor layer NSEM. For example, the common electrode layer CEL may be formed as a separate layer integrated with the second semiconductor layer NSEM, and may be electrically connected to the second semiconductor layer NSEM.

Each of the first connection electrodes CNE1 may be provided between the light-emitting elements LE1, LE2, LE3, and LE4 corresponding thereto and the pixel electrodes AE in the display region DA. Each of the first connection electrodes CNE1 may be in contact with one surface of the first semiconductor layer PSEM of the light-emitting elements LE1, LE2, LE3, and LE4 corresponding thereto. Each of the first connection electrodes CNE1 may be in contact with one surface of the pixel electrode AE corresponding thereto. Each of the first connection electrodes CNE1 may transmit the pixel voltage applied to the pixel electrodes AE to the light-emitting elements LE1, LE2, LE3, and LE4. A width of the first connection electrode CNE1 may be smaller than the width of each of the light-emitting elements LE1, LE2, LE3, and LE4, but the embodiment is not limited thereto.

Each of the first connection electrodes CNE1 may serve as a bonding metal for bonding the pixel electrode AE and the corresponding one of the light-emitting elements LE1, LE2, LE3, and LE4 to each other during a manufacturing process. Each of the first connection electrodes CNE1 may include a material that may be electrically connected to the pixel electrode AE and the corresponding one of the light-emitting elements LE1, LE2, LE3, and LE4. For example, the first connection electrode CNE1 may include at least one of gold (Au), copper (Cu), aluminum (Al), or tin (Sn), and/or may include a transparent conductive oxide such as indium tin oxide (ITO) and/or indium zinc oxide (IZO). In one or more embodiments, the first connection electrode CNE1 may include a first layer including any one of gold (Au), copper (Cu), aluminum (Al), or tin (Sn), and a second layer including another one of gold (Au), copper (Cu), aluminum (Al), or tin (Sn).

A second connection electrode CNE2 may be connected to the common electrode connection portion CVS corresponding thereto. The second connection electrode CNE2 may be provided on the common electrode connection portion CVS. The second connection electrode CNE2 may extend in the third direction DR3 and may be connected to the common electrode layer CEL. A height of the second connection electrode CNE2 may be substantially equal to a combined height of the light emitting element of the light-emitting elements LE1, LE2, LE3, and LE4 and the corresponding first connection electrode CNE1.

The second connection electrode CNE2 may include a material that may be electrically connected to the common electrode connection portion CVS. The second connection electrode CNE2 may be formed of the same material as the first connection electrode CNE1. For example, the second connection electrode CNE2 may include at least one of gold (Au), copper (Cu), aluminum (Al), or tin (Sn). In one or more embodiments, the second connection electrode CNE2 may include a first layer including any one of gold (Au), copper (Cu), aluminum (Al), or tin (Sn), and a second layer including another one of gold (Au), copper (Cu), aluminum (Al), or tin (Sn).

The second semiconductor layers SEM2 of the light-emitting elements LE1, LE2, LE3, and LE4 may be electrically connected to each other through the common electrode layer CEL. For example, the common electrode layer CEL may include the same material as the second semiconductor layer SEM2, and the second semiconductor layer SEM2 of each of the light-emitting elements LE1, LE2, LE3, and LE4 may be formed integrally with the common electrode layer CEL. For example, the second semiconductor layer SEM2 of each of the light-emitting elements LE1, LE2, LE3, and LE4 may protrude (e.g., downward) from the common electrode layer CEL. The second semiconductor layers SEM2 may be spaced apart from each other.

The common electrode layer CEL may be electrically connected to the common electrode connection portion CVS of the semiconductor circuit board 101 through the second connection electrode CNE2 provided in the common electrode regions CPA1 and CPA2. Accordingly, the common electrode layer CEL may receive the common voltage through the common electrode connection portion CVS of the semiconductor circuit board 101.

As shown in FIGS. 4 and 5, each of the plurality of pixels PX of the display panel 100 includes the first light-emitting element LE1 emitting (e.g., configured to emit) the first light, the second light-emitting element LE2 emitting (e.g., configured to emit) the second light, the third light-emitting element LE3 emitting (e.g., configured to emit) the third light, and the fourth light-emitting element LE4 emitting (e.g., configured to emit) the second light, and thus various colors may be displayed without a wavelength conversion layer.

Figure 6:
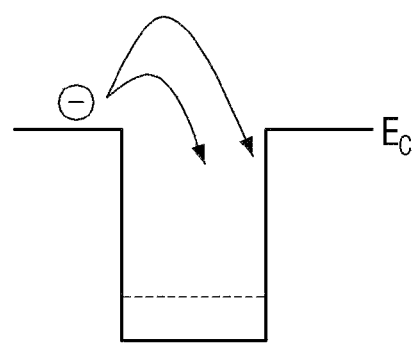
FIG. 6 is an illustrative view showing a band gap of a first active layer of the first light-emitting element when a driving current having a first current density is applied.
Figure 6:
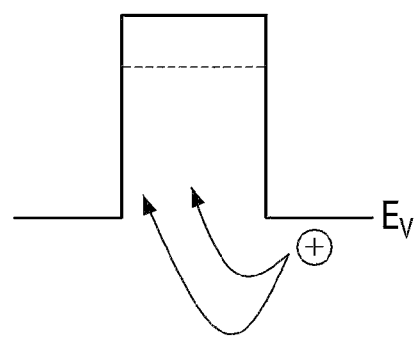
Figure 7:
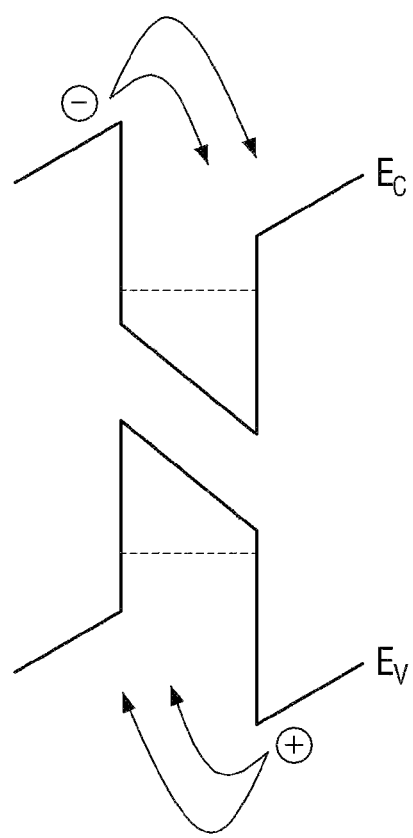
FIG. 7 is an illustrative view showing a band gap of the first active layer of the first light-emitting element when a driving current having a second current density is applied.

FIG. 6 is an illustrative view showing a band gap of a first active layer of a first light-emitting element when a driving current having a first current density is applied. FIG. 7 is an illustrative view showing a band gap of the first active layer of the first light-emitting element when a driving current having a second current density is applied.

Referring to FIGS. 6 and 7, the first light-emitting layer MQW1 of the first light-emitting element LE1 and the first light-emitting layer MQW1 of the second light-emitting element LE2 are formed of the same material. For example, the first light-emitting layer MQW1 of the first light-emitting element LE1 and the first light-emitting layer MQW1 of the second light-emitting element LE2 may be formed of InGaN having an indium (In) content of 30% to 45%.

In this case, light emitted from the first light-emitting element LE1 and the second light-emitting element LE2 may be shifted from red to blue depending on a current density. For example, a band gap between the first light-emitting layer MQW1 of the first light-emitting element LE1 and the first light-emitting layer MQW1 of the second light-emitting element LE2 may be changed from a rectangular shape as shown in FIG. 6 to a trapezoidal shape as shown in FIG. 7 by the quantum-confined Stark effect (QCSE) as the current density increases. In this case, the band filling in which carriers fill the quantum well of the first light-emitting layer MQW1 is faster when the band gap has a trapezoidal shape as shown in FIG. 7 than when the band gap has a rectangular shape as shown in FIG. 6, and thus when the band gap has a trapezoidal shape as shown in FIG. 7, electrons and holes may be recombined in a higher state. Therefore, as the density of current applied to the first light-emitting layer MQW1 of the first light-emitting element LE1 and the first light-emitting layer MQW1 of the second light-emitting element LE2 increases, the first light-emitting layer MQW1 of the first light-emitting element LE1 and the first light-emitting layer MQW1 of the second light-emitting element LE2 may emit light having a short wavelength. As the density of current applied to the first light-emitting layer MQW1 of the first light-emitting element LE1 and the first light-emitting layer MQW1 of the second light-emitting element LE2 decreases, the first light-emitting layer MQW1 of the first light-emitting element LE1 and the first light-emitting layer MQW1 of the second light-emitting element LE2 may emit light having a long wavelength.

As described above, even though the first light-emitting layer MQW1 of the first light-emitting element LE1 and the first light-emitting layer MQW1 of the second light-emitting element LE2 are formed of the same material, for example, the first light-emitting layer MQW1 of the first light-emitting element LE1 and the first light-emitting layer MQW1 of the second light-emitting element LE2 are formed of InGaN having an indium (In) content of 30% to 45%, it is possible to control the emission of the light having a long wavelength and the light having a short wavelength by adjusting the current density of the driving current applied to the first light-emitting layer MQW1.

Figure 8A:
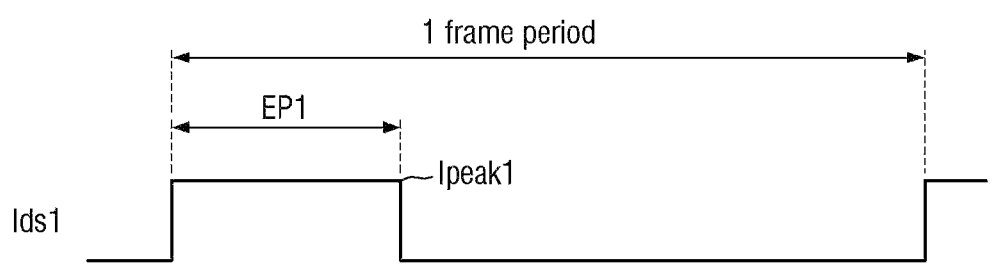
FIG. 8A is a waveform diagram showing a first driving current applied to a first light-emitting element according to one or more embodiments.
Figure 8B:
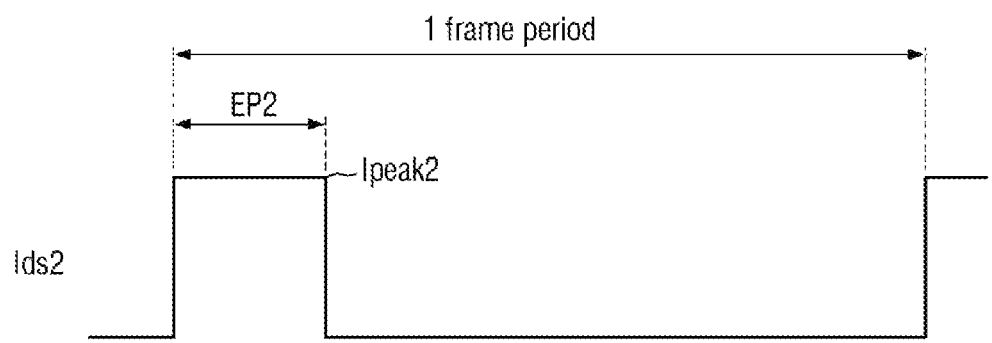
FIG. 8B is a waveform diagram showing a second driving current applied to a second light-emitting element according to one or more embodiments.

FIG. 8A is a waveform diagram showing a first driving current applied to a first light-emitting element of a first sub-pixel according to one or more embodiments. FIG. 8B is a waveform diagram showing a second driving current applied to a second light-emitting element of a second sub-pixel according to one or more embodiments.

FIGS. 8A and 8B show a first driving current Ids applied to the first light-emitting element LE1 and a second driving current Ids2 applied to the second light-emitting element LE2 during one frame period. FIGS. 8A and 8B illustrate the first driving current Ids1 when the first light-emitting element LE1 expresses the peak white gray level, and the second driving current Ids2 when the second light-emitting element LE2 expresses the peak white gray level. The peak white gray level indicates the brightest brightness that may be expressed by the first light-emitting element LE1 and the second light-emitting element LE2.

Referring to FIGS. 8A and 8B, the first light-emitting layer MQW1 of the first light-emitting element LE1 and the first light-emitting layer MQW1 of the second light-emitting element LE2 are formed of the same material. In this case, a current density of the second driving current Ids2 applied to the second light-emitting element LE2 may be higher than a current density of the first driving current Ids1 applied to the first light-emitting element LE1, so that the first light-emitting element LE1 emits (or may emit) the first light and the second light-emitting element LE2 emits (or may emit) the second light. In some embodiments, in order for the first light-emitting element LE1 to emit the first light of the same wavelength band regardless of the gray level, the current density of the first driving current Ids1 may be the same regardless of the gray level. In order for the second light-emitting element LE2 to emit the second light of the same wavelength band regardless of the gray level, the current density of the second driving current Ids2 may be the same regardless of the gray level.

Because the current density of the second driving current Ids2 is greater than the current density of the first driving current Ids1, a second peak current value Ipeak2 of the second driving current Ids2 may be higher than a first peak current value Ipeak1 of the first driving current Ids1.

The gray level of the first light-emitting element LE1 may be adjusted depending on a period EP1 in which the first driving current Ids1 is applied to the first light-emitting element LE1. For example, in the first light-emitting element LE1, as the application period EP1 of the first driving current Ids1 increases, it is possible to express gray level close to the peak white gray level, and as the application period EP1 of the first driving current Ids1 decreases, it is possible to express gray level close to the peak black gray level.

The gray level of the second light-emitting element LE2 may be adjusted depending on a period EP2 in which the second driving current Ids2 is applied to the second light-emitting element LE2. For example, in the second light-emitting element LE2, as the application period EP2 of the second driving current Ids2 increases, it is possible to express gray level close to the peak white gray level, and as the application period EP2 of the second driving current Ids2 decreases, it is possible to express gray level close to the peak black gray level.

Because the current density of the first driving current Ids1 is lower than the current density of the second driving current Ids2, the application period EP1 of the first driving current Ids1 applied to the first light-emitting element LE1 expressing the peak white gray level may be longer than the application period EP2 of the second driving current Ids2 applied to the second light-emitting element LE2 expressing the peak white gray level. For example, when the first light-emitting element LE1 and the second light-emitting element LE2 express the same gray level, the application period EP1 of the first driving current Ids1 may be longer than the application period EP2 of the second driving current Ids2.

Because the fourth light-emitting element LE4 emits the second light substantially the same as that of the second light-emitting element LE2, the fourth driving current applied to the fourth light-emitting element LE4 may be substantially equal to the second driving current Ids2 described with reference to FIG. 9. Therefore, description of the fourth driving current is not provided.

In one or more embodiments, the third light-emitting element LE3 may emit light depending on the third driving current. The gray level expression of the third light-emitting element LE3 may be similar to that of the first light-emitting element LE1 and the second light-emitting element LE2. For example, a current density of the third driving current may be the same regardless of the gray level of the third light-emitting element LE3. In this case, the gray level of the third light-emitting element LE3 may be adjusted depending on a period in which the third driving current is applied to the third light-emitting element LE3. For example, in the third light-emitting element LE3, as the application period of the third driving current increases, it is possible to express gray level close to the peak white gray level, and as the application period of the third driving current decreases, it is possible to express gray level close to the peak black gray level.

In one or more embodiments, the gray level of the third light-emitting element LE3 may be adjusted depending on the current density of the third driving current. For example, as the current density of the third driving current increases, the gray level of the third light-emitting element LE3 expresses gray level close to the peak white gray level, and as the current density of the third driving current decreases, the gray level of the third light-emitting element LE3 expresses gray level close to the peak black gray level.

As described above, even though the first light-emitting layer MQW1 of the first light-emitting element LE1 and the first light-emitting layer MQW1 of the second light-emitting element LE2 are formed of the same material, the first light-emitting element LE1 may emit the first light and the second light-emitting element LE2 may emit the second light by making the current density of the second driving current Ids2 applied to the second light-emitting element LE2 higher than the current density of the first driving current Ids1 applied to the first light-emitting element LE1.

In some embodiments, in order for the first light-emitting element LE1 to emit the first light of the same wavelength band regardless of the gray level, the current density of the first driving current Ids1 may be controlled to be the same regardless of the gray level, and the gray level of the first light-emitting element LE1 may be adjusted depending on the application period EP1 of the first driving current Ids1. order for the second light-emitting element LE2 to emit the second light of the same wavelength band regardless of the gray level, the current density of the second driving current Ids2 may be controlled to be the same regardless of the gray level, and the gray level of the second light-emitting element LE2 may be adjusted depending on the application period EP2 of the second driving current Ids2.

Figure 9A:
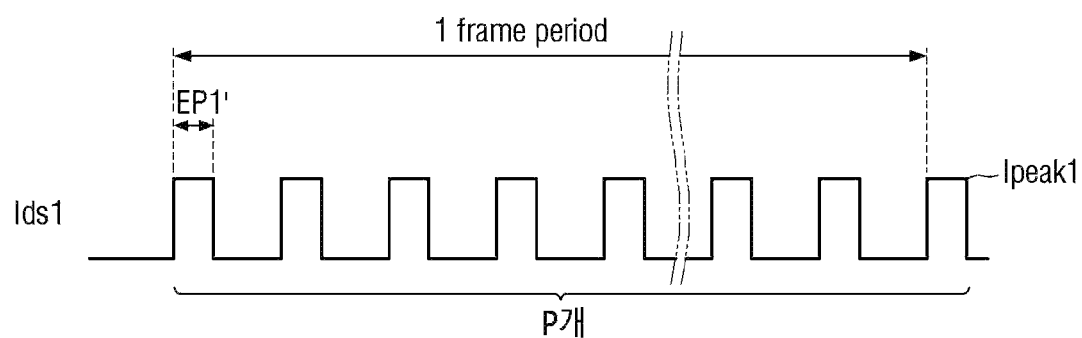
FIG. 9A is a waveform diagram showing a first driving current applied to a first light-emitting element according to one or more other embodiments.
Figure 9B:
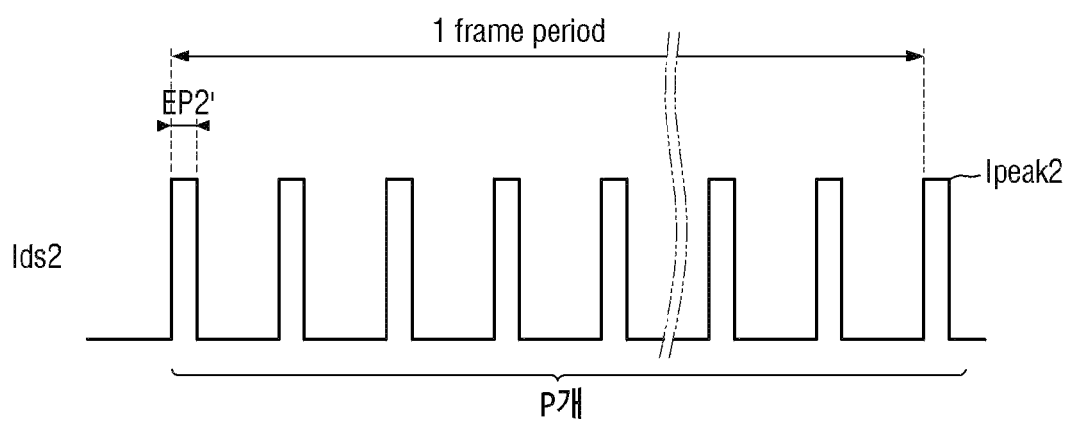
FIG. 9B is a waveform diagram showing a second driving current applied to a second light-emitting element according to one or more other embodiments.

FIG. 9A is a waveform diagram showing a first driving current applied to a first light-emitting element according to one or more other embodiments. FIG. 9B is a waveform diagram showing a second driving current applied to a second light-emitting element according to one or more other embodiments.

The embodiment of FIGS. 9A and 9B is different from the embodiment of FIGS. 8A and 8B in that the first driving current Ids1 is applied to the first light-emitting element LE1 multiple times during one frame period and the second driving current Ids2 is applied to the second light-emitting element LE2 multiple times during one frame period. In FIGS. 9A and 9B, differences from the embodiment of FIGS. 8A and 8B will be mainly described.

Referring to FIGS. 9A and 9B, the first driving current Ids1 may be applied to the first light-emitting element LE1 P times during one frame period. For example, the one frame period may include an application period EP1' of the first driving current Ids1 P times. The application period EP1' of the first driving current Ids1 P times may be equal to each other.

The second driving current Ids2 may be applied to the second light-emitting element LE2 P times during one frame period. For example, the one frame period may include an application period EP2' of the second driving current Ids2 P times. The application period EP2' of the second driving current Ids2 P times may be equal to each other.

The gray level of the first light-emitting element LE1 may be adjusted depending on the application period EP1' of the first driving current Ids1. For example, in the first light-emitting element LE1, as the application period EP1' of the first driving current Ids1 increases, it is possible to express gray level close to the peak white gray level, and as the application period EP1' of the first driving current Ids1 decreases, it is possible to express gray level close to the peak black gray level.

The gray level of the second light-emitting element LE2 may be adjusted depending on the application period EP2' of the second driving current Ids2. For example, in the second light-emitting element LE2, as the application period EP2' of the second driving current Ids2 increases, it is possible to express gray level close to the peak white gray level, and as the application period EP2' of the second driving current Ids2 decreases, it is possible to express gray level close to the peak black gray level.

Because the current density of the first driving current Ids1 is lower than the current density of the second driving current Ids2, when the first light-emitting element LE1 and the second light-emitting element LE2 express the same gray level, the application period EP1' of the first driving current Ids1 may be longer than the application period EP2' of the second driving current Ids2. In addition, because the first driving current Ids1 is applied to the first light-emitting element LE1 P times during one frame period and the second driving current Ids2 is applied to the second light-emitting element LE2 P times during one frame period, the sum of the application periods EP1' of the first driving current Ids1 may be longer than the sum of the application periods EP2' of the second driving current Ids2 during the one frame period.

Because the fourth light-emitting element LE4 emits the second light substantially the same as that of the second light-emitting element LE2, the fourth driving current applied to the fourth light-emitting element LE4 may be substantially equal to the second driving current Ids2 described with reference to FIGS. 9A and 9B. Therefore, description of the fourth driving current is not provided.

In addition, because the third driving current may also be similar to the first driving current Ids1 and the second driving current Ids2 described with reference to FIGS. 9A and 9B, description of the third driving current will not be provided.

Figure 10:
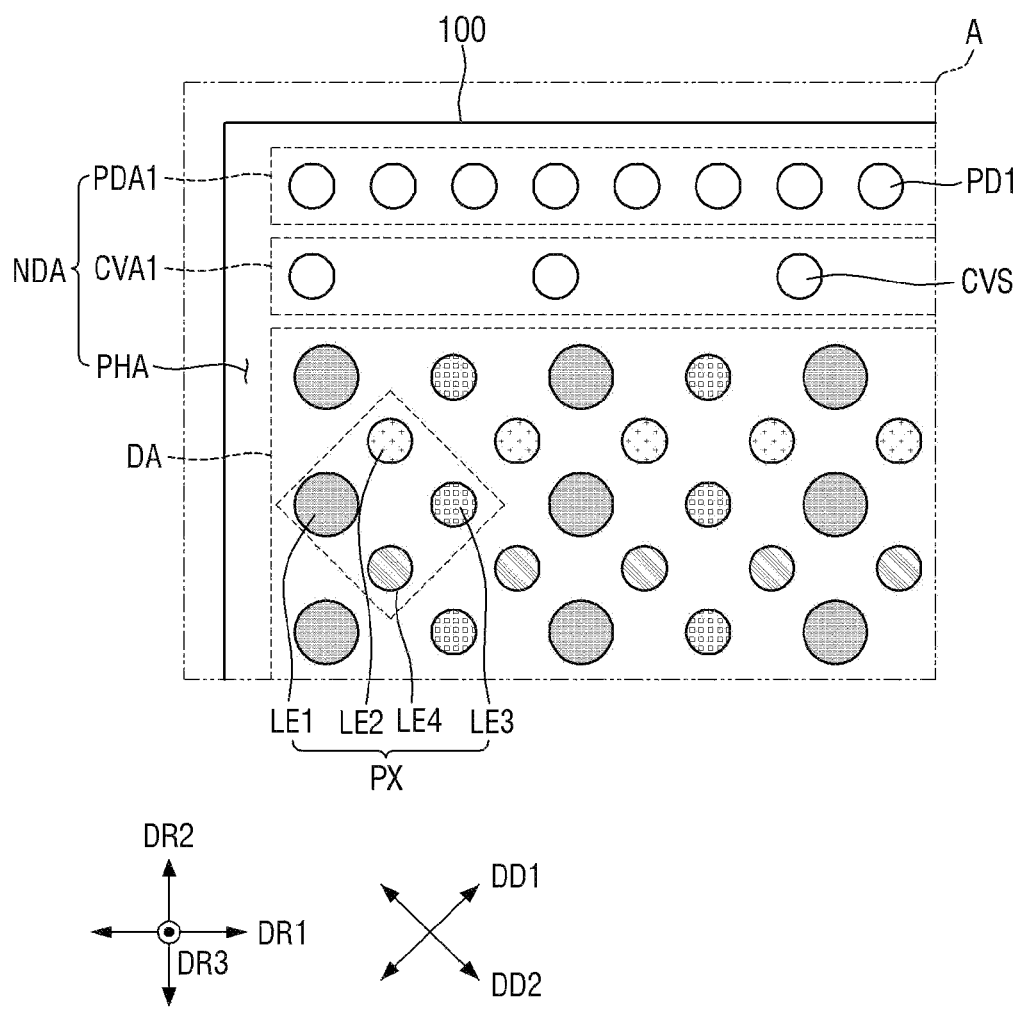
FIG. 10 is a layout view showing one or more embodiments of region A in FIG. 1.

FIG. 10 is a layout view showing another example of region A in FIG. 1.

The embodiment of FIG. 10 is different from the embodiment of FIG. 2 in that an area of the first light-emitting element LE1 is greater than an area of the second light-emitting element LE2 and an area of the fourth light-emitting element LE4. In FIG. 10, descriptions overlapping the embodiment of FIG. 2 will not be provided.

Referring to FIG. 10, when luminous efficiency of the first light-emitting element LE1 is lower than those of the second light-emitting element LE2 and the fourth light-emitting element LE4, in order to compensate for this, the area of the first light-emitting element LE1 may be greater than those of the second light-emitting element LE2 and the fourth light-emitting element LE4. Because the second light-emitting element LE2 and the fourth light-emitting element LE4 emit the second light according to the second driving current Ids2, the second light-emitting element LE2 and the fourth light-emitting element LE4 may have substantially the same area.

FIG. 10 illustrates that an area of the third light-emitting element LE3 is smaller than that of the first light-emitting element LE1 and is substantially the same as those of the second light-emitting element LE2 and the fourth light-emitting element LE4, but the embodiment of the present specification is not limited thereto. In one or more embodiments, when the luminous efficiency of the third light-emitting element LE3 is higher than those of the second light-emitting element LE2 and the fourth light-emitting element LE4, the area of the third light-emitting element LE3 may be smaller than those of the second light-emitting element LE2 and the fourth light-emitting element LE4.

Because the area of the first light-emitting element LE1 is greater than the area of the second light-emitting element LE2, the area of the third light-emitting element LE3, and the area of the fourth light-emitting element LE4, a distance between the first light-emitting element LE1 and the second light-emitting element LE2 adjacent to each other and a distance between the first light-emitting element LE1 and the fourth light-emitting element LE4 adjacent to each other may be smaller than a distance between the second light-emitting element LE2 and the third light-emitting elements LE3 adjacent to each other and a distance between the third light-emitting elements LE3 and the fourth light-emitting element LE4 adjacent to each other. The distance between the first light-emitting element LE1 and the second light-emitting element LE2 adjacent to each other and the distance between the first light-emitting element LE1 and the fourth light-emitting element LE4 adjacent to each other may be substantially the same. The distance between the second light-emitting element LE2 and the third light-emitting elements LE3 adjacent to each other and the distance between the third light-emitting elements LE3 and the fourth light-emitting element LE4 adjacent to each other may be substantially the same.

Figure 11A:
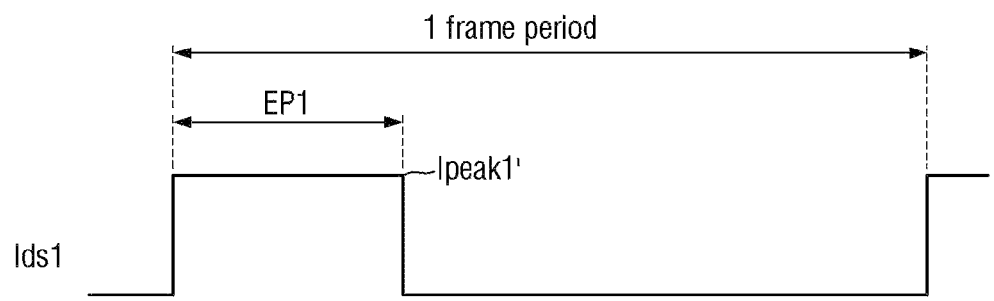
FIG. 11A is a waveform diagram showing a first driving current applied to a first light-emitting element according to one or more other embodiments.
Figure 11B:
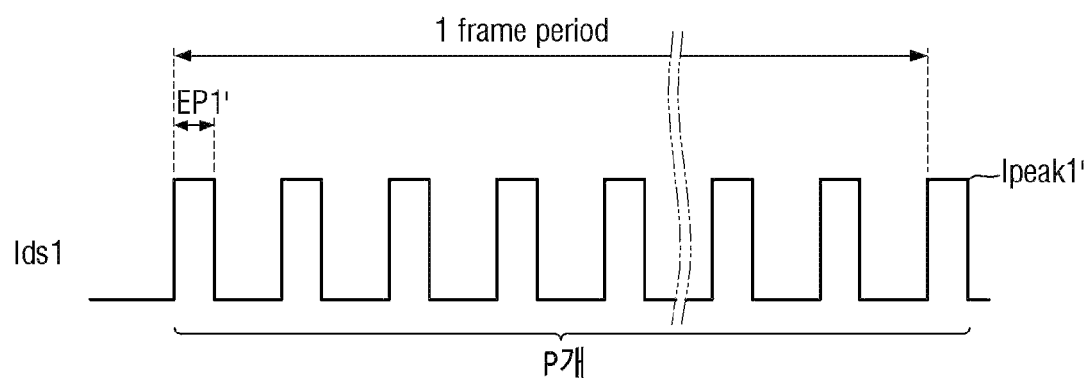
FIG. 11B is a waveform diagram showing a first driving current applied to a first light-emitting element according to one or more other embodiments.

FIG. 11A is a waveform diagram showing a first driving current applied to a first light-emitting element according to one or more other embodiments. FIG. 11B is a waveform diagram showing a first driving current applied to a first light-emitting element according to one or more other embodiments.

Figure 12:
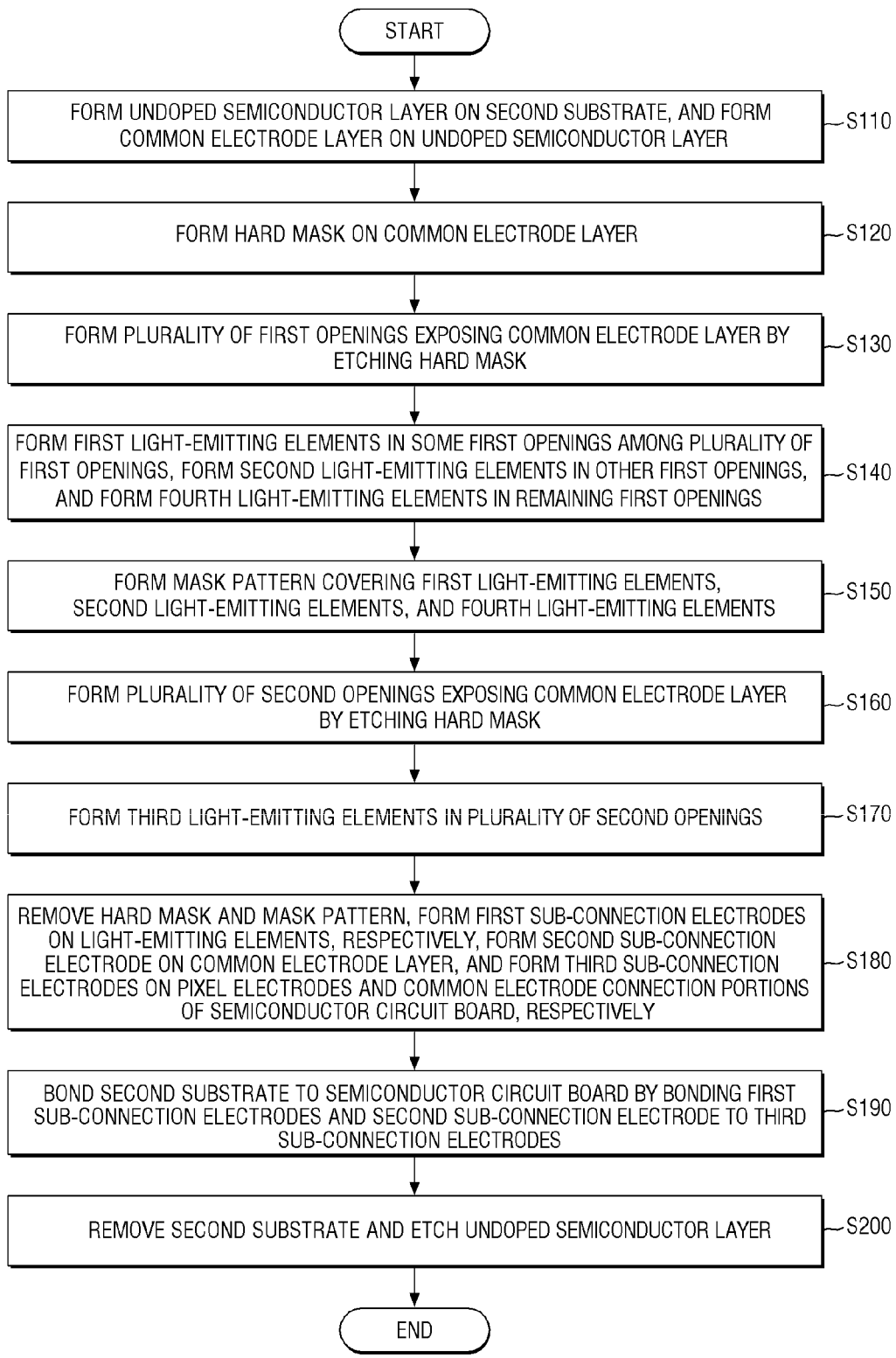
FIG. 12 is a flowchart showing a method of manufacturing a display device according to one or more embodiments.

Referring to FIGS. 11A and 11B, because the area of the first light-emitting element LE1 is greater than those of the second light-emitting element LE2 and the fourth light-emitting element LE4, a first peak current value Ipeak1' of a first driving current Ids1 that flows through the first light-emitting element LE1 may be higher that the first peak current value Ipeak1 of the first driving current Ids1 when the area of the first light-emitting element LE1 is substantially equal to those of the second light-emitting element LE2 and the fourth light-emitting element LE4 as shown in FIGS. 8A and 9A. For example, in order to uniformly (or substantially uniformly) maintain the current density of the first driving current Ids1 flowing through the first light-emitting element LE1 irrespective of an increase in the area of the first light-emitting element LE1, the first peak current value Ipeak1' of the first driving current Ids1 may increase in proportion to the area of the first light-emitting element LE1. FIG. 12 is a flowchart showing a method of manufacturing a display device according to one or more embodiments. FIGS. 13 to 22 are cross-sectional views showing the method of manufacturing a display device according to one or more embodiments.

Hereinafter, the method of manufacturing a display device according to one or more embodiments will be described in more detail with reference to FIGS. 12 to 22.

Figure 13:
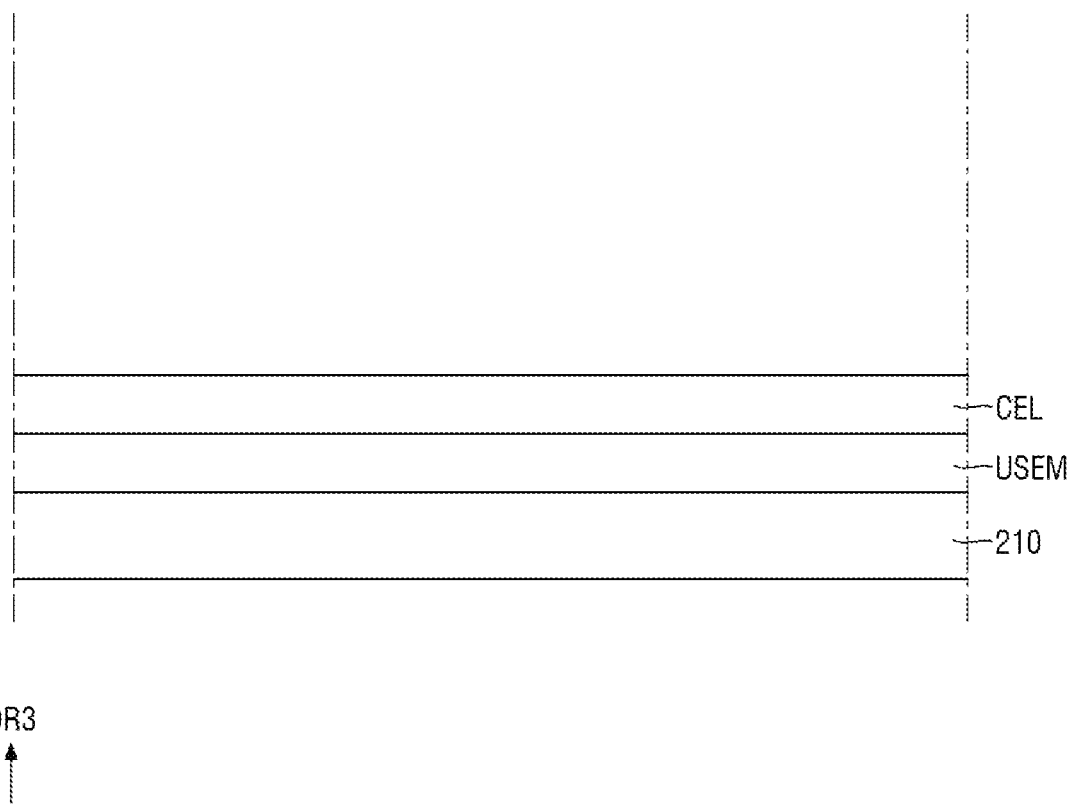
FIGS. 13-22 are sectional views for describing a method of manufacturing a display device according to one or more embodiments.

First, as shown in FIG. 13, an undoped semiconductor layer USEM is formed on a second substrate 210, and a common electrode layer CEL is formed on the undoped semiconductor layer USEM (S110 in FIG. 12).

The second substrate 210 may be a sapphire substrate ($Al_2O_3$) and/or a silicon wafer including silicon. However, the second substrate 210 is not limited thereto, and the second substrate 210 may be a semiconductor substrate such as a GaAs substrate. Hereinafter, a case in which the second substrate 210 is a sapphire substrate will be described as an example.

The undoped semiconductor layer USEM may include an undoped semiconductor, and may be a material that is not doped with an n-type or a p-type dopant. For example, the undoped semiconductor layer USEM may include at least one of undoped InAlGaN, GaN, AlGaN, InGaN, AlN, or InN, but the embodiment is not limited thereto. It is exemplified in FIG. 13 that one undoped semiconductor layer USEM is formed on the second substrate 210, but the embodiment is not limited thereto, and a plurality of undoped semiconductor layers USEM may be formed on the second substrate 210. The undoped semiconductor layer USEM may be provided to reduce a lattice constant difference between the common electrode layer CEL and the second substrate 210.

The common electrode layer CEL may include an n-type semiconductor. For example, the common electrode layer CEL may include one or more of AlGaInN, GaN, AlGaN, InGaN, AlN, or InN doped with an n-type dopant.

The undoped semiconductor layer USEM and the common electrode layer CEL may be formed by an epitaxial growth method. An epitaxial growth process may include electron beam deposition, physical vapor deposition (PVD), chemical vapor deposition (CVD), plasma laser deposition (PLD), dual-type thermal evaporation, sputtering, metal-organic chemical vapor deposition (MOCVD), and/or the like. As an example, the epitaxial growth process may be performed by a metal-organic chemical vapor deposition (MOCVD) method, but the embodiment is not limited thereto.

A precursor material for forming a plurality of semiconductor material layers is not particularly limited and may include any suitable target material. As an example, the precursor material may be a metal precursor including an alkyl group such as a methyl group and/or an ethyl group. For example, the precursor material may be a compound such as trimethyl gallium ($Ga(CH_3)_3$), trimethyl aluminum ($Al(CH_3)_3$), and/or triethyl phosphate ($(C_2H_5)_3PO_4$), but the embodiment is not limited thereto.

Figure 14:
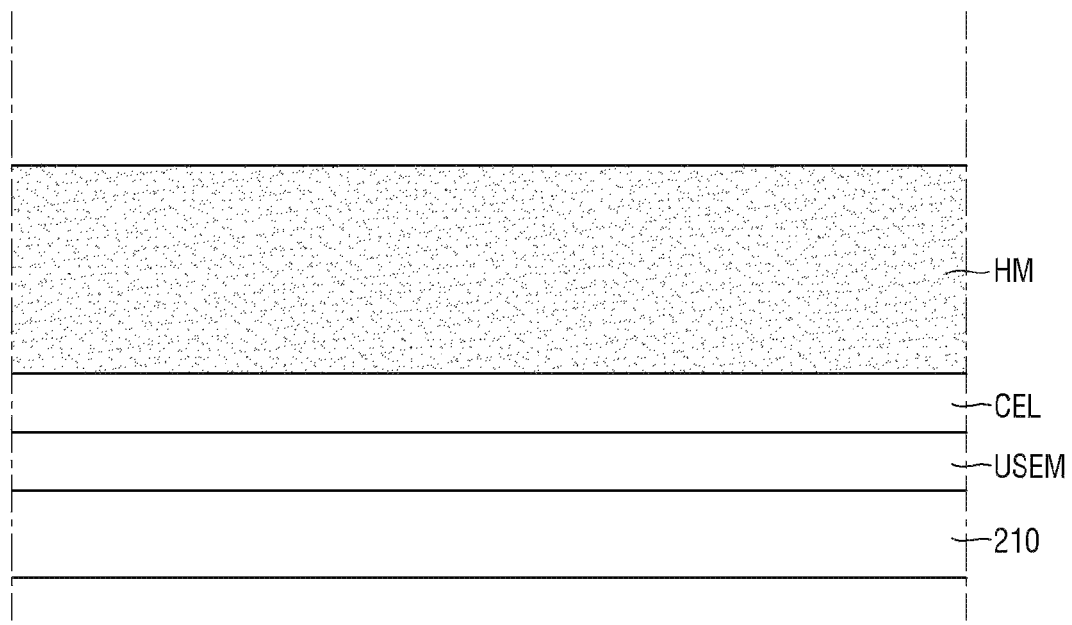

Second, as shown in FIG. 14, a hard mask HM is formed on the common electrode layer CEL (S120 in FIG. 12).

The hard mask HM may be entirely on the common electrode layer CEL. The hard mask HM may include an insulating material such as silicon oxide (SiOx), silicon nitride (SiNx), silicon oxynitride (SiOxNy), and/or the like. The hard mask HM may function as a mask in a process for forming the light-emitting elements LE1, LE2, LE3, and LE4.

Figure 15:
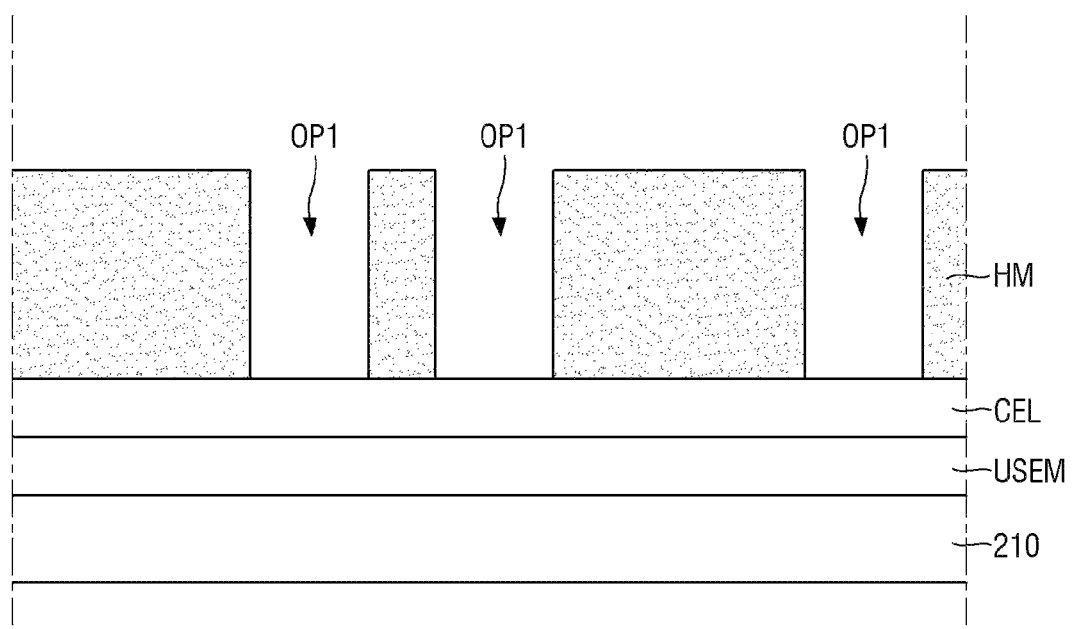

Third, as shown in FIG. 15, the hard mask HM is etched to form a plurality of first openings OP1 exposing the common electrode layer CEL (S130 in FIG. 12).

In one or more embodiments, a separate mask is provided on the hard mask HM except for a region where the plurality of first openings OP1 are formed, and the hard mask HM is etched by wet etching or dry etching, thereby forming the plurality of first openings OP1.

The plurality of first openings OP1 may be formed to be spaced apart from each other. The spacing and width of the plurality of first openings OP1 may be set in consideration of the arrangement and width of the first light-emitting elements LE1, the second light-emitting elements LE2, and the fourth light-emitting elements LE4.

Figure 16:
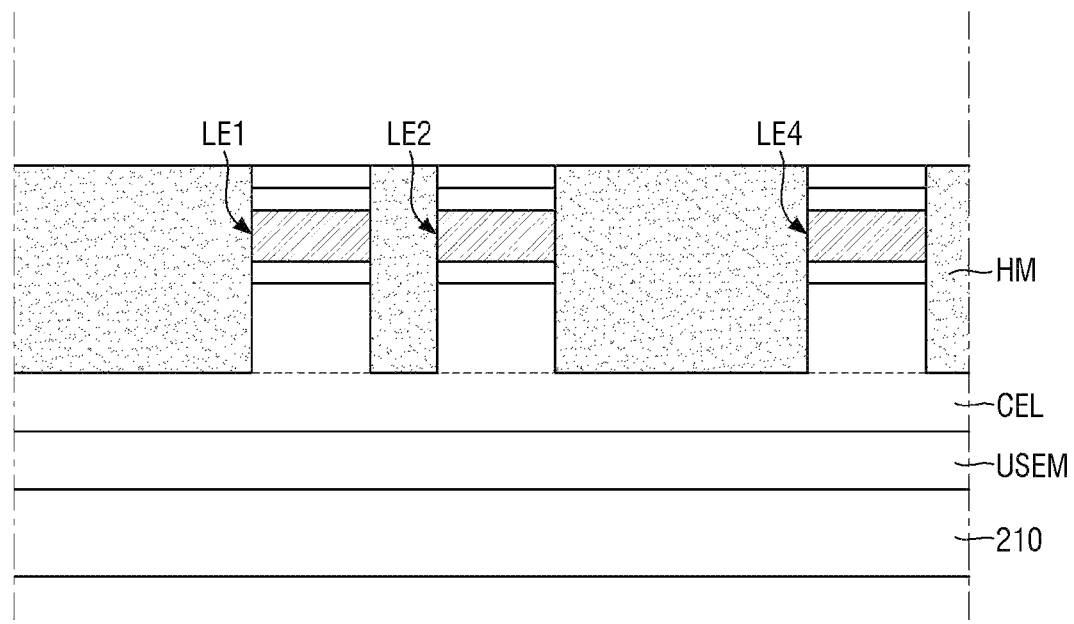

Fourth, as shown in FIG. 16, the first light-emitting elements LE1 are formed in some first openings OP1 among the plurality of first openings OP1, the second light-emitting elements LE2 are formed in other first openings OP1, and the fourth light-emitting elements LE4 are formed in the remaining first openings OP1 (S140 in FIG. 12).

The process of forming the first light-emitting elements LE1, the second light-emitting elements LE2, and the fourth light-emitting elements LE4 may be performed by an epitaxial growth method. When an upper surface of the common electrode layer CEL is exposed through the plurality of first openings OP1, a semiconductor crystal is grown by injecting the precursor material onto the common electrode layer CEL. A second semiconductor layer NSEM of each of the first light-emitting elements LE1, the second light-emitting elements LE2, and the fourth light-emitting elements LE4 provided on the common electrode layer CEL includes substantially the same material as the common electrode layer CEL, and may be formed by growing a semiconductor crystal of the common electrode layer CEL. Accordingly, the common electrode layer CEL and the second semiconductor layer NSEM of each of the first light-emitting elements LE1, the second light-emitting elements LE2, and the fourth light-emitting elements LE4 may be integrated (e.g., may be integrally formed).

Then, a superlattice layer SLT, a first active layer MQW1, an electron blocking layer EBL, and a first semiconductor layer PSEM are sequentially grown to complete the first light-emitting elements LE1, the second light-emitting elements LE2, and the fourth light-emitting elements LE4, respectively. In operation S140, the first light-emitting elements LE1, the second light-emitting elements LE2, and the fourth light-emitting elements LE4 having the first active layer MQW1 may be formed.

Figure 17:
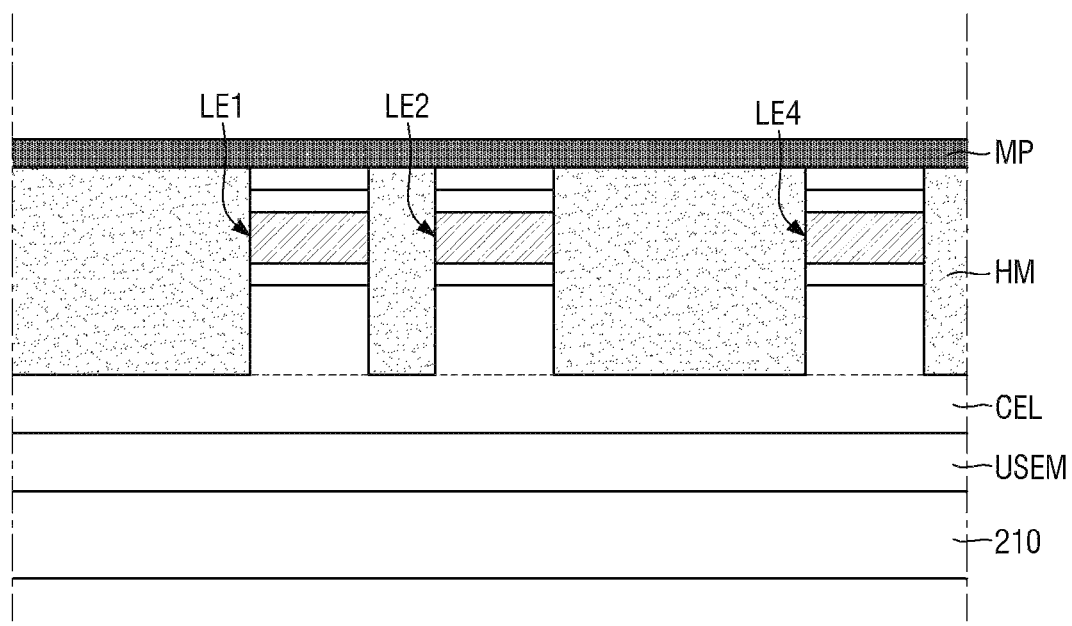

Fifth, as shown in FIG. 17, a mask pattern MP covering the first light-emitting elements LE1, the second light-emitting elements LE2, and the fourth light-emitting elements LE4 is formed (S150 in FIG. 12).

The mask pattern MP may be formed of an inorganic film such as a silicon oxide film ($SiO_2$), an aluminum oxide film ($Al_2O_3$), and/or a hafnium oxide film ($HfO_x$), but the embodiment of the present specification is not limited thereto. The mask pattern MP may include the same material as the hard mask HM.

The mask pattern MP may be a protective film (e.g., a barrier film) for protecting the first light-emitting elements LE1, the second light-emitting elements LE2, and the fourth light-emitting elements LE4. The mask pattern MP may be provided to cover each of the first light-emitting elements LE1, the second light-emitting elements LE2, and the fourth light-emitting elements LE4. In some embodiments, the mask pattern MP may be provided to cover the entire upper surface of the hard mask HM.

Figure 18:
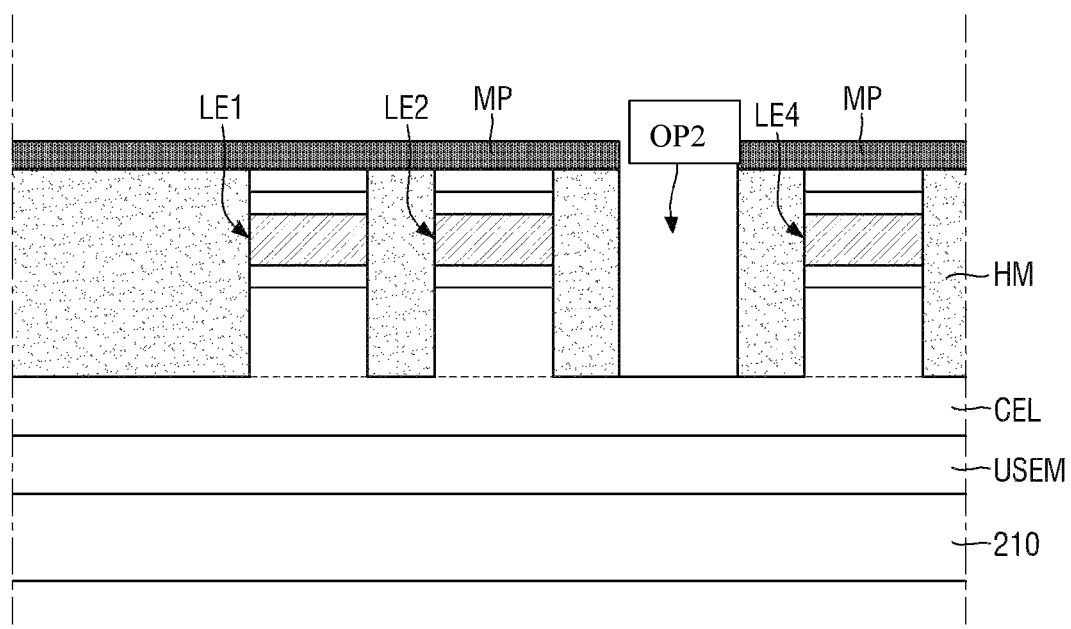

Sixth, as shown in FIG. 18, the hard mask HM is etched to form a plurality of second openings OP2 exposing the common electrode layer CEL (S160 in FIG. 12).

In one or more embodiments, a separate mask is provided on the hard mask HM except for a region where the plurality of second openings OP2 are to be formed, and the hard mask HM is etched by wet etching or dry etching, thereby forming the plurality of second openings OP2.

The plurality of second openings OP2 may be formed to be spaced apart from each other. The spacing and width of the plurality of second openings OP2 may be set in consideration of the arrangement and width of the third light-emitting elements LE3.

Figure 19:
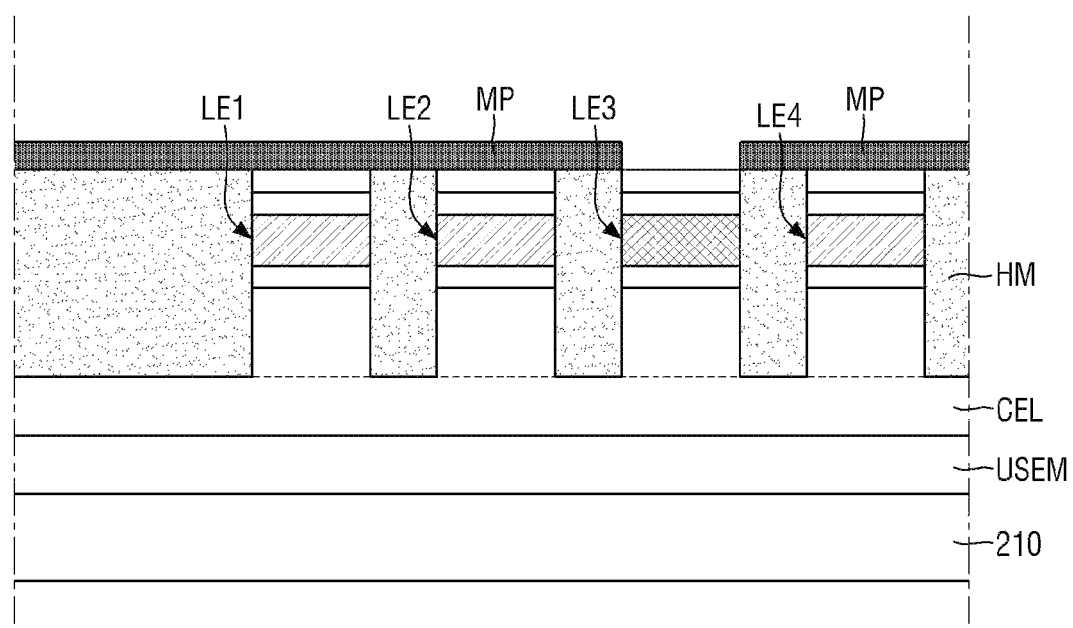

Seventh, as shown in FIG. 19, the third light-emitting elements LE3 are formed in the plurality of second openings OP2 (S170 in FIG. 12).

The process of forming the third light-emitting elements LE3 may be performed by an epitaxial growth method. When an upper surface of the common electrode layer CEL is exposed through the plurality of second openings OP2, a semiconductor crystal is grown by injecting a precursor material onto the common electrode layer CEL. The second semiconductor layer NSEM of each of the third light-emitting elements LE3 provided on the common electrode layer CEL includes substantially the same material as the common electrode layer CEL, and may be formed by growing the semiconductor crystal of the common electrode layer CEL. Accordingly, the common electrode layer CEL and the second semiconductor layer NSEM of each of the third light-emitting elements LE3 may be integrated (e.g., may be integrally formed).

Then, a superlattice layer SLT, a second active layer MQW2, an electron blocking layer EBL, and a first semiconductor layer PSEM are sequentially grown to complete the third light-emitting elements LE3. In operation S170, the third light-emitting elements LE3 having the second active layer MQW2 may be formed.

Figure 20:
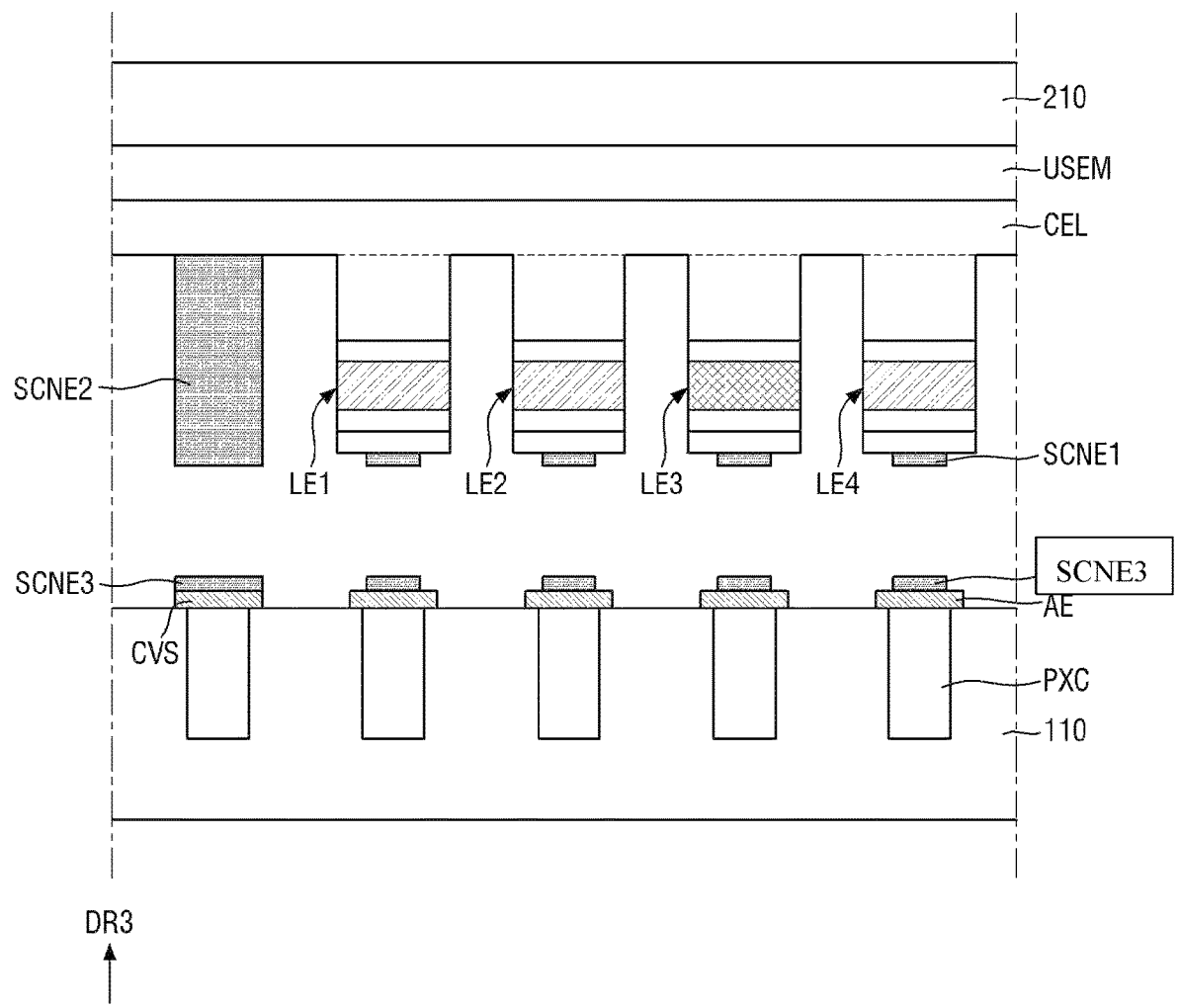

Eighth, as in FIG. 20, the hard mask HM and the mask pattern MP are removed, first sub-connection electrodes SCNE1 are respectively formed on the light-emitting elements LE1, LE2, LE3, and LE4, a second sub-connection electrode SCNE2 is formed on the common electrode layer CEL, and third sub-connection electrodes SCNE3 are respectively formed on the pixel electrodes AE and the common electrode connection portions CVS of the semiconductor circuit board 101 (S180 in FIG. 12).

The hard mask HM and the mask pattern MP may be etched at once through an etching process. The etching process may be dry etching, wet etching, reactive ion etching (RIE), deep reactive ion etching (DRIE), inductively coupled plasma reactive ion etching (ICP-RIE), and/or the like.

Then, the first sub-connection electrode SCNE1 may be formed on an upper surface of the first semiconductor layer PSEM of each of the light-emitting elements LE1, LE2, LE3, and LE4 through a photolithography process.

The second sub-connection electrode SCNE2 may be formed on the common electrode layer CEL through the photolithography process.

Further, the third sub-connection electrodes SCNE3 may be respectively formed on the pixel electrodes AE and the common electrode connection portions CVS of the semiconductor circuit board 101 through the photolithography process.

The first sub-connection electrodes SCNE1, the second sub-connection electrode SCNE2, and the third sub-connection electrodes SCNE3 may serve as the bonding metal. For example, the first sub-connection electrodes SCNE1, the second sub-connection electrode SCNE2, and the third sub-connection electrodes SCNE3 may include at least one of gold (Au), copper (Cu), aluminum (Al), or tin (Sn), and/or may include a transparent conductive oxide such as indium tin oxide (ITO) and/or indium zinc oxide (IZO).

Figure 21:
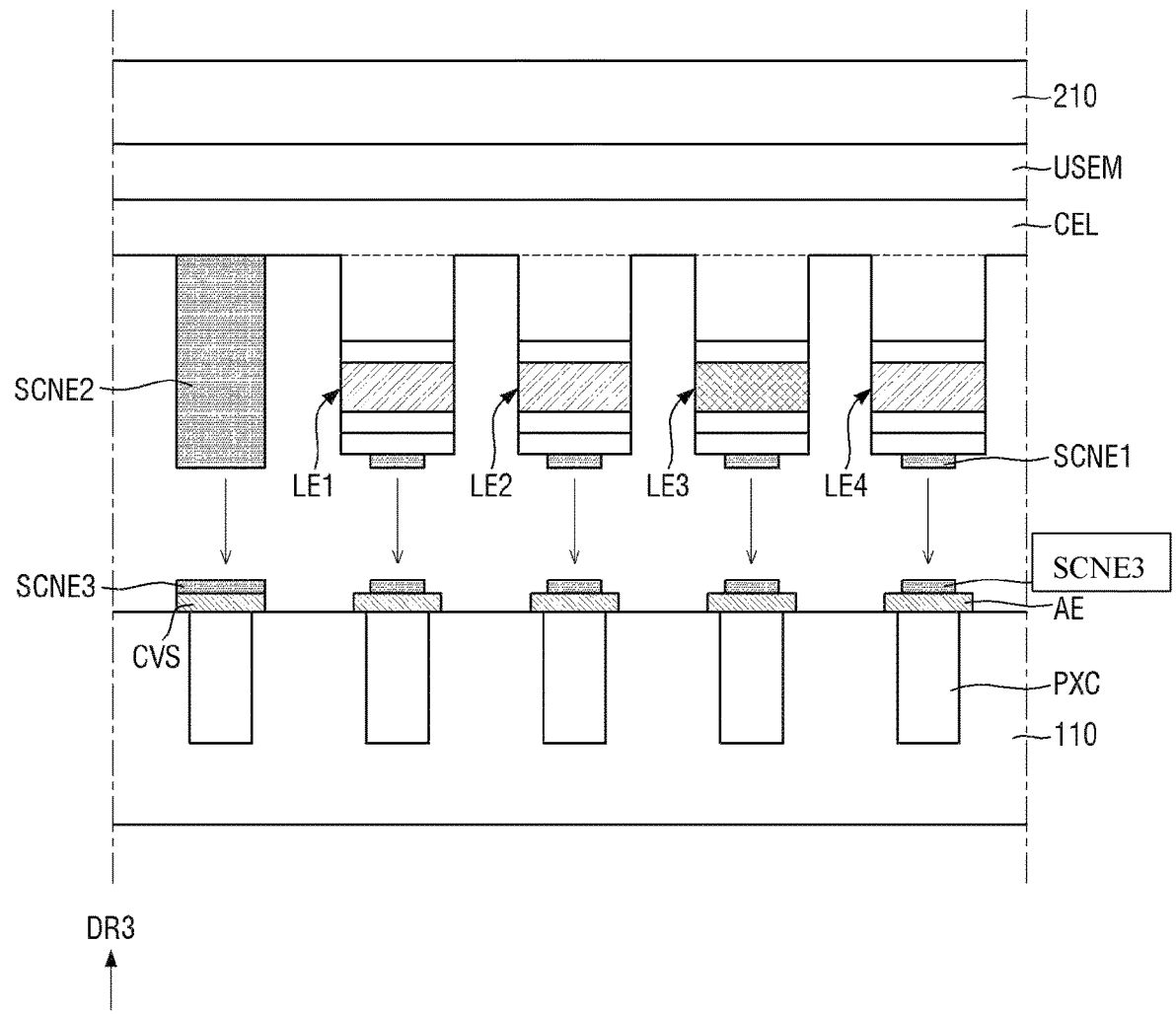

Ninth, as shown in FIG. 21, the second substrate 210 is bonded to the semiconductor circuit board 101 by bonding the first sub-connection electrodes SCNE1 and the second sub-connection electrode SCNE2 to the third sub-connection electrodes SCNE3 (S190 in FIG. 12).

The first sub-connection electrodes SCNE1 of the second substrate 210 may be aligned to respectively correspond to the pixel electrodes AE of the semiconductor circuit board 101. Also, the second sub-connection electrode SCNE2 of the second substrate 210 may be aligned to correspond to the common electrode connection portions CVS of the first substrate 110. For example, the first sub-connection electrodes SCNE1 of the second substrate 210 may overlap the pixel electrodes AE of the semiconductor circuit board 101 in the third direction DR3, respectively. The second sub-connection electrode SCNE2 of the second substrate 210 may overlap the common electrode connection portions CVS of the first substrate 110 in the third direction DR3.

Then, the first sub-connection electrodes SCNE1 and the second sub-connection electrode SCNE2 of the second substrate 210 are brought into contact with the third sub-connection electrodes SCNE3 of the semiconductor circuit board 101. Then, the first sub-connection electrodes SCNE1, the second sub-connection electrode SCNE2, and the third sub-connection electrodes SCNE3 are melt-bonded at a set or predetermined temperature. Accordingly, the second substrate 210 may be bonded to the semiconductor circuit board 101.

Figure 22:
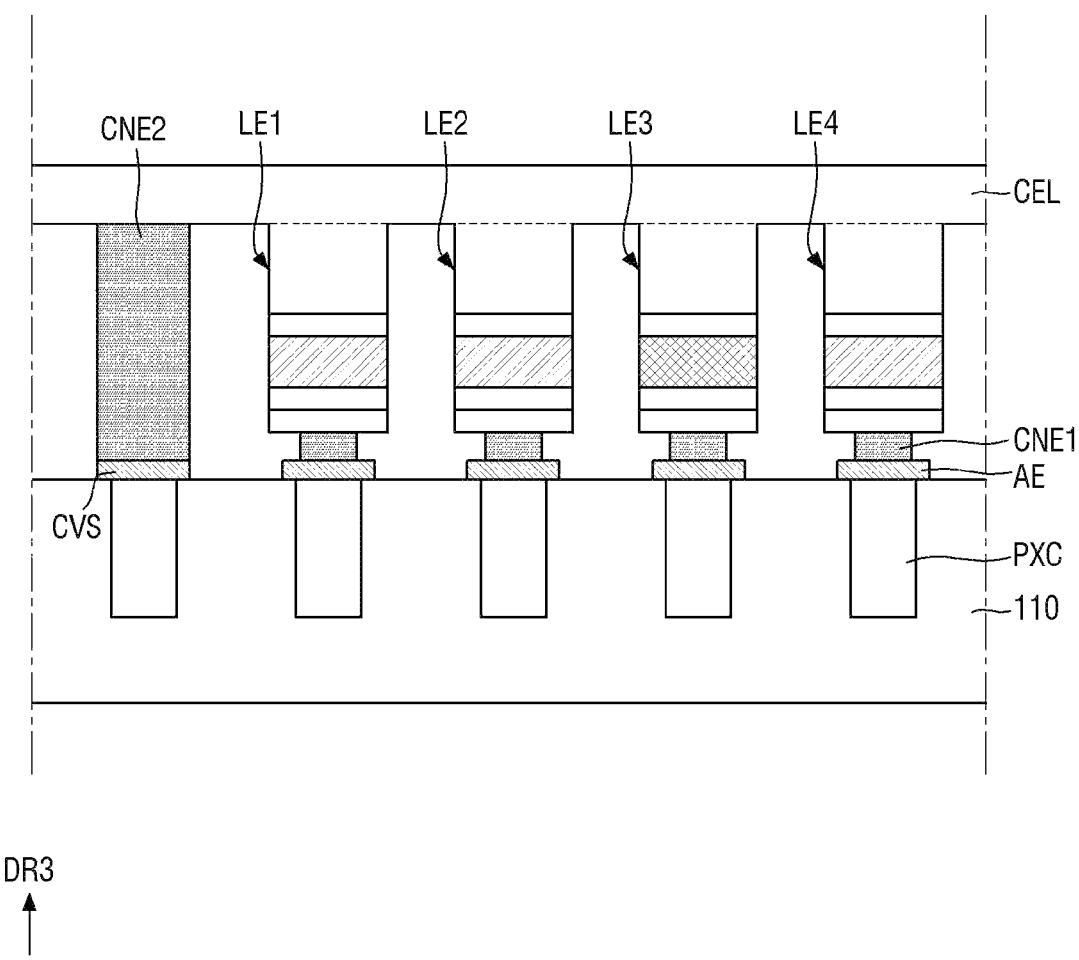

Tenth, as shown in FIG. 22, the second substrate 210 is removed, and the undoped semiconductor layer USEM is etched (S200 in FIG. 12).

The second substrate 210 may be separated from the undoped semiconductor layer USEM by a laser lift-off process. In one or more embodiments, the second substrate 210 may be removed through a polishing process such as a chemical mechanical polishing (CMP) process and/or an etching process.

The undoped semiconductor layer USEM may be removed through a polishing process such as a CMP process, and/or may be removed by wet etching and/or dry etching. When the undoped semiconductor layer USEM is removed, a part of the common electrode layer CEL may be removed.

As described above, the first light-emitting elements LE1, the second light-emitting elements LE2, and the fourth light-emitting elements LE4 are simultaneously (e.g., concurrently) formed of the same material, and the first light-emitting elements LE1 may emit the first light and the second light-emitting elements LE2 and the fourth light-emitting elements LE4 may emit the second light by making the current density of the second driving current Ids2 applied to the second light-emitting elements LE2 and the current density of the fourth driving current Ids4 applied to the fourth light-emitting elements LE4 higher than the current density of the first driving current Ids1 applied to the first light-emitting elements LE1. Accordingly, a manufacturing process may be simplified and manufacturing cost may be reduced as compared with a case in which the first light-emitting elements LE1 emitting the first light, the second light-emitting elements LE2 and the fourth light-emitting elements LE4 emitting the second light, and the third light-emitting elements LE4 3 emitting the third light are separately formed.

Figure 23:
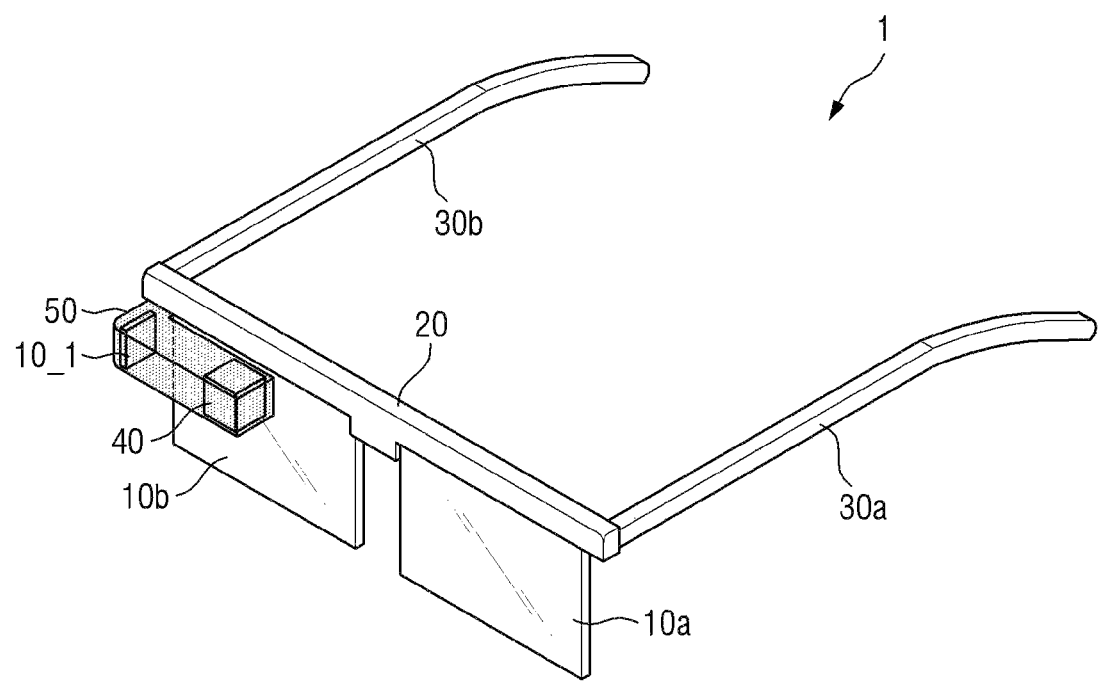
FIG. 23 is an illustrative view showing a virtual reality device including a display device according to one or more embodiments.

FIG. 23 is an view showing a virtual reality device including a display device according to one or more embodiments. FIG. 23 shows a virtual reality device 1 to which a display device 10_1 according to one or more embodiments is applied.

Referring to FIG. 23, the virtual reality device 1 according to one or more embodiments may be a device in the form of glasses. The virtual reality device 1 according to one or more embodiments may include the display device 10_1, a left eye lens 10a, a right eye lens 10b, a support frame 20, glasses frame legs 30a and 30b, a reflective member 40, and a display device accommodating unit 50.

FIG. 23 illustrates the virtual reality device 1 including the glasses frame legs 30a and 30b, but the virtual reality device 1 according to one or more embodiments may also be applied to a head mounted display including a head mounted band that may be mounted on the head instead of the glasses frame legs 30a and 30b. For example, the virtual reality device 1 according to one or more embodiments is not limited to that shown in FIG. 23, and may be applied in various other suitable forms to various suitable electronic devices.

The display device accommodating unit 50 may include the display device 10_1 and the reflective member 40. An image displayed on the display device 10_1 may be reflected by the reflective member 40 and provided to the right eye of a user through the right eye lens 10b. Accordingly, the user may view a virtual reality image displayed on the display device 10_1 through the right eye.

It is exemplified in FIG. 23 that the display device accommodating unit 50 is provided at a right end of the support frame 20, but the embodiment of the present specification is not limited thereto. For example, the display device accommodating unit 50 may be provided at a left end of the support frame 20, and in this case, the image displayed on the display device 101 may be reflected by the reflective member 40 and provided to the left eye of the user through the left eye lens 10a. Accordingly, the user may view the virtual reality image displayed on the display device 10_1 through the left eye. In one or more embodiments, the display device accommodating unit 50 may be provided at both the left and right ends of the support frame 20. In this case, the user may view the virtual reality image displayed on the display device 10_1 through both the left and right eyes.

Figure 24:
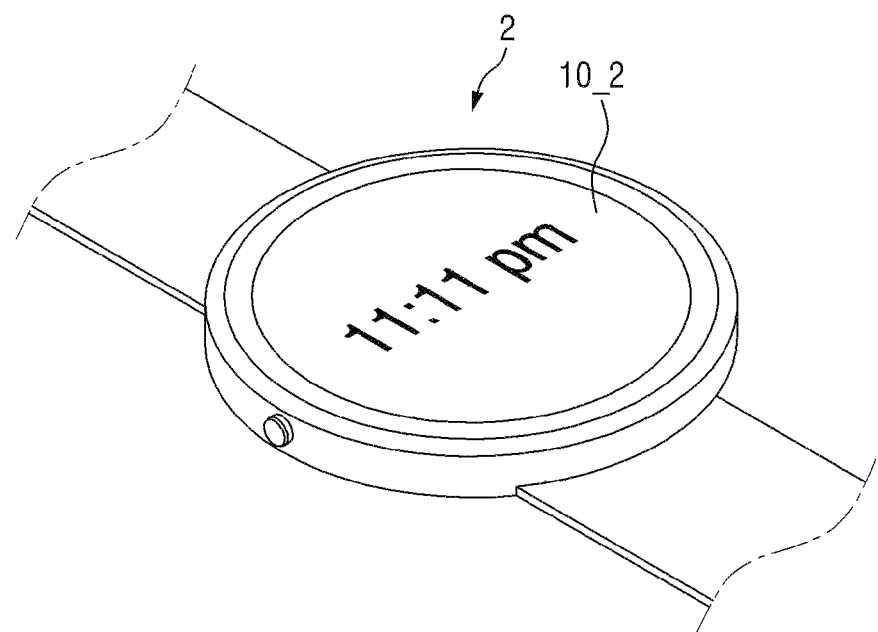
FIG. 24 is an illustrative view showing a smart device including a display device according to one or more embodiments.

FIG. 24 is an illustrative view showing a smart device including a display device according to one or more embodiments.

Referring to FIG. 24, a display device 10_2 according to one or more embodiments may be applied to a smart watch 2 that is one of smart devices.

Figure 25:
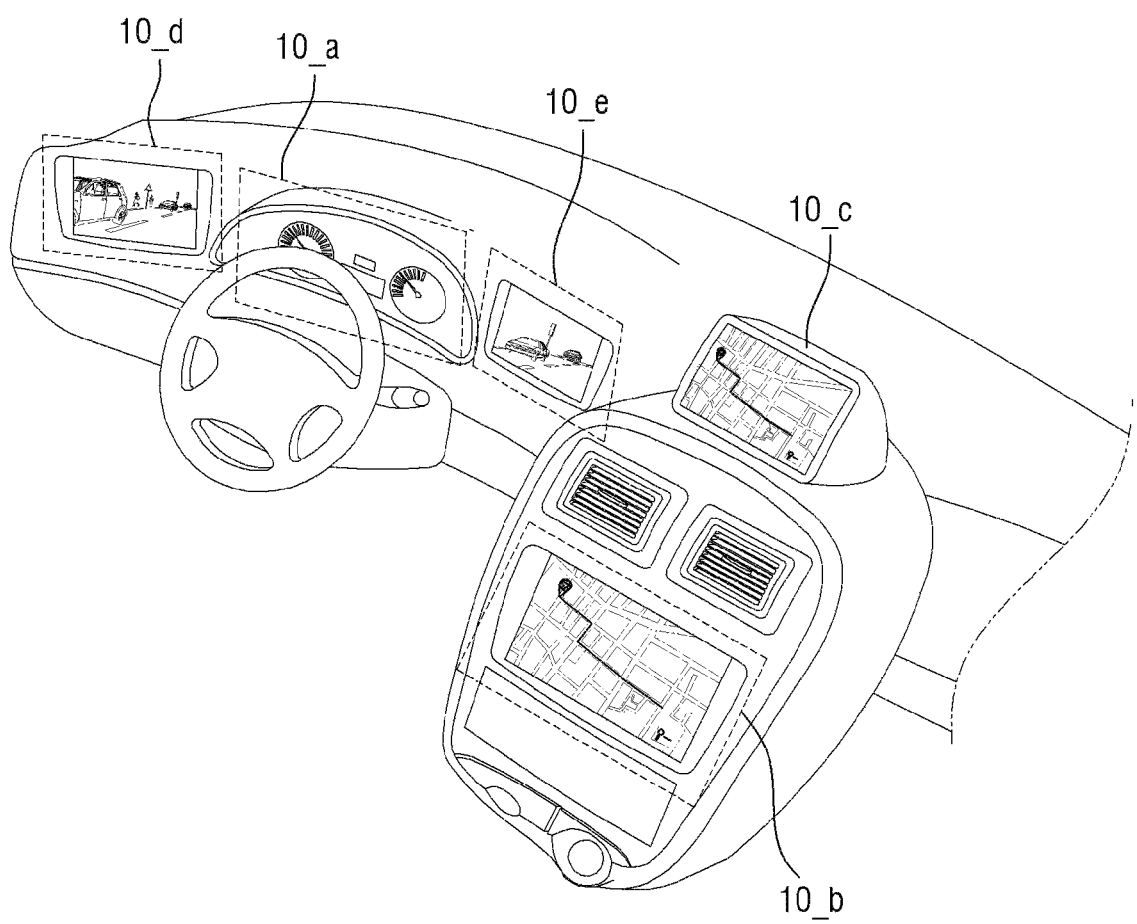
FIG. 25 is an illustrative view showing an instrument panel and a center fascia of a vehicle including a display device according to one or more embodiments.

FIG. 25 is an illustrative view showing an instrument panel and a center fascia of a vehicle including a display device according to one or more embodiments. FIG. 25 shows a vehicle to which display devices 10_a, 10_b, 10_c, 10_d, and 10_e according to one or more embodiments are applied.

Referring to FIG. 25, the display devices 10_a, 10_b, and 10_c according to one or more embodiments may be applied to the instrument panel of the vehicle, the center fascia of the vehicle, and/or a center information display (CID) provided on a dashboard of the vehicle. Also, the display devices 10_d and 10_e according to one or more embodiments may be applied to rear view mirror displays instead of wing mirrors of the vehicle.

Figure 26:
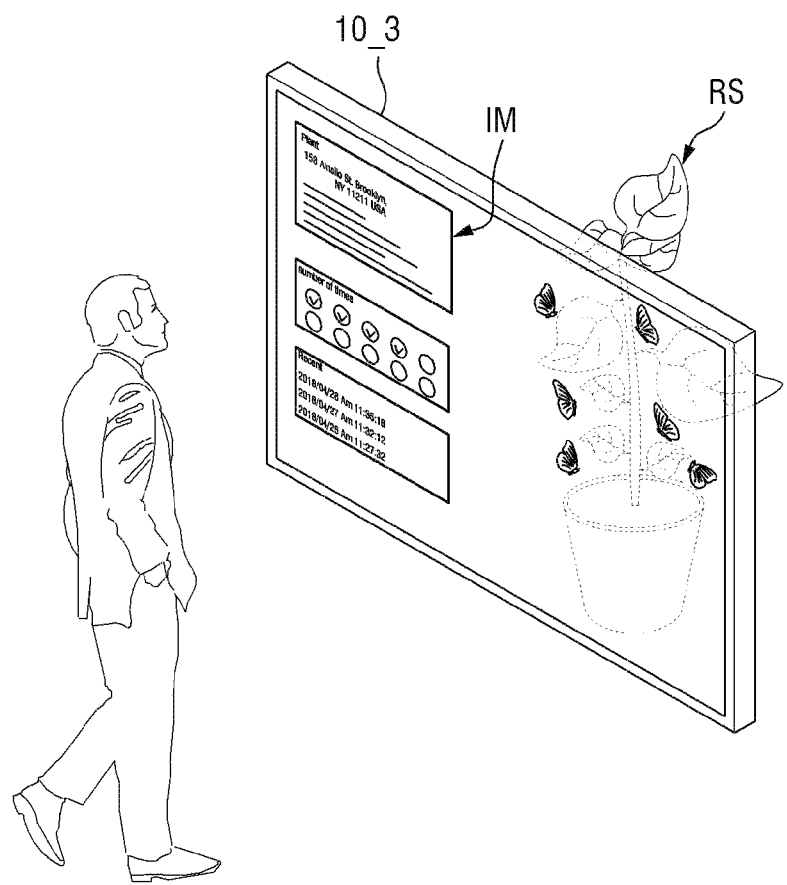
FIG. 26 is an illustrative view showing a transparent display device including a display device according to one or more embodiments.

FIG. 26 is a view showing a transparent display device including a display device according to one or more embodiments.

Referring to FIG. 26, a display device 10_3 according to one or more embodiments may be applied to the transparent display device. The transparent display device may transmit light while displaying an image IM. Therefore, the user positioned at the front of the transparent display device may not only view the image IM displayed on the display device 10_3 but also see an object RS and/or a background positioned on a rear surface of the transparent display device. When the display device 10_3 is applied to the transparent display device, the first substrate 110 shown in FIG. 4 may include a light-transmitting portion that may transmit light and/or may be formed of a material that may transmit light.

However, the aspects and features of embodiments of the present disclosure are not limited to the one set forth herein. The above and other aspects and features of embodiments of the present disclosure will become more apparent to one of ordinary skill in the art to which the present disclosure pertains by referencing the claims, with functional equivalents thereof to be included therein.

What is claimed is:
1. A display device comprising:
   a substrate;
   a plurality of pixel electrodes on the substrate and spaced apart from each other; and
   a plurality of light-emitting elements on the plurality of pixel electrodes, respectively, and
   wherein the plurality of light-emitting elements comprise a first light-emitting element configured to emit a first light, a second light-emitting element configured to emit a second light, a third light-emitting element configured to emit a third light, and
   wherein the first light, the second light, and the third light have different wavelengths from each other, and
   wherein an active layer of the first light-emitting element has a same material as an active layer of the second light-emitting element, and
   wherein an active layer of the third light-emitting element has a different material as the active layer of the first light-emitting element and the active layer of the second light-emitting element.

2. The display device of claim 1, wherein the active layer of the first light-emitting element and the active layer of the second light-emitting element includes In (Indium), Ga (Gallium) and N (Nitride).

3. The display device of claim 2, wherein the active layer of the third light-emitting element includes In (Indium) and Ga (Gallium).

4. The display device of claim 3, wherein a content of indium in the active layer of the third light-emitting element is smaller than a content of indium in the active layer of the first light-emitting element and a content of indium in the active layer of the second light-emitting element.

5. The display device of claim 2, wherein a content of indium in the active layer of the first light-emitting element and a content of indium in the active layer of the second light-emitting element is in a range from 30% to 45%.

6. The display device of claim 1, wherein each of the first light-emitting element, the second light-emitting element, and the third light-emitting element includes a connection electrode between a pixel electrode of the plurality of pixel electrodes and a first surface of the active layer, a first semiconductor layer disposed between the connection electrode and the first surface of the active layer, and a second semiconductor layer disposed on a second surface of the active layer opposite the first surface of the active layer.

7. The display device of claim 6, wherein a width of the connection electrode in one direction is smaller than a width of the first semiconductor layer in the one direction.

8. The display device of claim 1, further comprising: a common electrode layer disposed on the plurality of light-emitting elements and to which a common voltage is applied.

9. The display device of claim 8, wherein the common electrode is integrated with the plurality of light-emitting elements.

10. The display device of claim 1, wherein the first light-emitting element is configured to emit the first light according to a first driving current, and
wherein the second light-emitting element is configured to emit the second light according to a second driving current, the first light having a different wavelength than the second light.

11. The display device of claim 10, wherein a current density of the first driving current is lower than a current density of the second driving current.

12. The display device of claim 10, wherein a first peak current value of the first driving current is lower than a second peak current value of the second driving current.

13. The display device of claim 10, wherein a current density of the first driving current is the same regardless of a gray level of the first light-emitting element, and a current density of the second driving current is the same regardless of a gray level of the second light-emitting element.

14. The display device of claim 13, wherein an application period of the first driving current when the first light-emitting element is to emit light a peak white gray level is longer than an application period of the second driving current when the second light-emitting element is to emit light with a peak white gray level.

15. The display device of claim 13, wherein during one frame period, an application period of the first driving current is repeated a plurality of first times, and an application period of the second driving current is repeated a plurality of second times.

16. The display device of claim 15, wherein the application period of the first driving current in a first time of the plurality of first times is different from the application period of the second driving current in a second time of the plurality of second times.

17. The display device of claim 16, wherein a number of the plurality of first times is same as a number of the plurality of second times.

18. The display device of claim 16, wherein during the one frame period, a sum of application periods of the first driving current during the plurality of first times is different from a sum of application periods of the second driving current during the plurality of second times.

19. The display device of claim 1, wherein the plurality of light-emitting elements further comprise a fourth light-emitting element configured to emit a second light, and
wherein an active layer of the third light-emitting element has a same material as an active layer of the second light-emitting element, and
wherein the active layer of the third light-emitting element has a different material as the active layer of the fourth light-emitting element.

20. The display device of claim 1, wherein a wavelength conversion layer is not disposed on the plurality of light-emitting elements.

* * * * *

UNITED STATES PATENT AND TRADEMARK OFFICE
CERTIFICATE OF CORRECTION

| | | |
|---|---|---|
| PATENT NO. | : 12,406,618 B2 | Page 1 of 1 |
| APPLICATION NO. | : 18/611413 | |
| DATED | : September 2, 2025 | |
| INVENTOR(S) | : Jin Wan Kim et al. | |

It is certified that error appears in the above-identified patent and that said Letters Patent is hereby corrected as shown below:

On the Title Page

In item (72), in Column 1, under "Inventors", Line 5, delete "Anyang-si" and insert -- Asan-si --.

Signed and Sealed this
Tenth Day of February, 2026

John A. Squires
*Director of the United States Patent and Trademark Office*